(12) United States Patent
Vlasenko

(10) Patent No.: US 8,125,256 B2
(45) Date of Patent: Feb. 28, 2012

(54) BIAS GENERATOR PROVIDING FOR LOW POWER, SELF-BIASED DELAY ELEMENT AND DELAY LINE

(75) Inventor: Peter A. Vlasenko, Kanata (CA)

(73) Assignee: Research In Motion Limited, Waterloo (CA)

( * ) Notice: Subject to any disclaimer, the term of this patent is extended or adjusted under 35 U.S.C. 154(b) by 0 days.

(21) Appl. No.: 13/152,478

(22) Filed: Jun. 3, 2011

(65) Prior Publication Data

US 2011/0234308 A1 Sep. 29, 2011

Related U.S. Application Data

(60) Continuation of application No. 12/621,983, filed on Nov. 19, 2009, now Pat. No. 7,977,985, which is a division of application No. 11/763,506, filed on Jun. 15, 2007, now abandoned.

(51) Int. Cl.
*H03L 7/085* (2006.01)

(52) U.S. Cl. ........ 327/157; 327/148; 327/149; 327/158; 327/161; 327/261; 327/284; 327/288; 327/538; 327/543

(58) Field of Classification Search .......... 327/147–149, 327/156–158, 161–163, 261, 264, 269–272, 327/276–278, 281, 284, 285, 288, 538, 540, 327/541, 543
See application file for complete search history.

(56) References Cited

U.S. PATENT DOCUMENTS

| | | | |
|---|---|---|---|
| 5,399,995 A * | 3/1995 | Kardontchik et al. | 331/17 |
| 5,515,012 A * | 5/1996 | Bhushan et al. | 331/17 |
| 5,717,362 A | 2/1998 | Maneatis et al. | |
| 5,727,037 A | 3/1998 | Maneatis | |
| 6,556,088 B1 | 4/2003 | Dietl et al. | |
| 6,686,788 B2 | 2/2004 | Kim et al. | |
| 6,710,670 B2 * | 3/2004 | Maneatis | 331/185 |
| 6,747,507 B1 * | 6/2004 | Sadate et al. | 327/541 |
| 6,777,995 B1 | 8/2004 | Harrison | |
| 6,831,492 B1 * | 12/2004 | Abbasi et al. | 327/158 |
| 6,873,214 B2 | 3/2005 | Harwood | |
| 6,903,586 B2 | 6/2005 | Abbasi et al. | |
| 6,985,045 B2 | 1/2006 | Zhang et al. | |
| 7,078,977 B2 | 7/2006 | Maneatis | |
| 7,112,990 B2 | 9/2006 | Waldstein et al. | |

(Continued)

OTHER PUBLICATIONS

Maneatis, John G. and Horowitz, Mark A.; Precise Delay Generation Using Coupled Oscillators, IEEE Journal of Solid-State Circuits, Dec. 1993, vol. 28. No. 12, Stanford University, Stanford, CA, USA.

(Continued)

*Primary Examiner* — Lincoln Donovan
*Assistant Examiner* — Patrick O'Neill
(74) *Attorney, Agent, or Firm* — Ridout & Maybee LLP

(57) ABSTRACT

An improved bias generator incorporates a reference voltage and/or a reference current into the generation of bias voltages. In some cases, the output of a biased delay element has a constant voltage swing. A delay line of such constant output voltage swing delay elements may be shown to provide reduced power consumption compared to some known self-biased delay lines. Furthermore, in other cases, providing the reference current to a novel bias generator allows a delay line of delay elements biased by such a novel bias generator to show reduced sensitivity to operating conditions, reduced sensitivity to variation in process parameters and improved signal quality, thereby providing more robust operation.

12 Claims, 13 Drawing Sheets

U.S. PATENT DOCUMENTS

| | | |
|---|---|---|
| 7,176,737 B2 | 2/2007 | Baker et al. |
| 7,205,813 B2 | 4/2007 | Kang |
| 7,251,305 B2 | 7/2007 | Gauthier et al. |
| 7,403,057 B2 | 7/2008 | Cranford et al. |
| 7,977,985 B2 * | 7/2011 | Vlasenko ............... 327/157 |
| 2002/0101292 A1 | 8/2002 | Maneatis |
| 2003/0206066 A1 | 11/2003 | Harwood |
| 2004/0104764 A1 | 6/2004 | Sadate et al. |
| 2004/0135639 A1 | 7/2004 | Maneatis |
| 2004/0135640 A1 | 7/2004 | Maneatis |
| 2005/0007157 A1 | 1/2005 | Harrison |
| 2006/0012441 A1 | 1/2006 | Maneatis |
| 2006/0022760 A1 | 2/2006 | Wu et al. |
| 2008/0265970 A1 | 10/2008 | Vlasenko |

OTHER PUBLICATIONS

Maneatis, John G., Low-Jitter Process-Independent DLL and PLL Based on Self-Biased Techniques, IEEE Journal of Solid-State Circuits, Nov. 1996, vol. 31. No. 11, Silicon Graphics Inc., Mountain View, CA, USA.

* cited by examiner

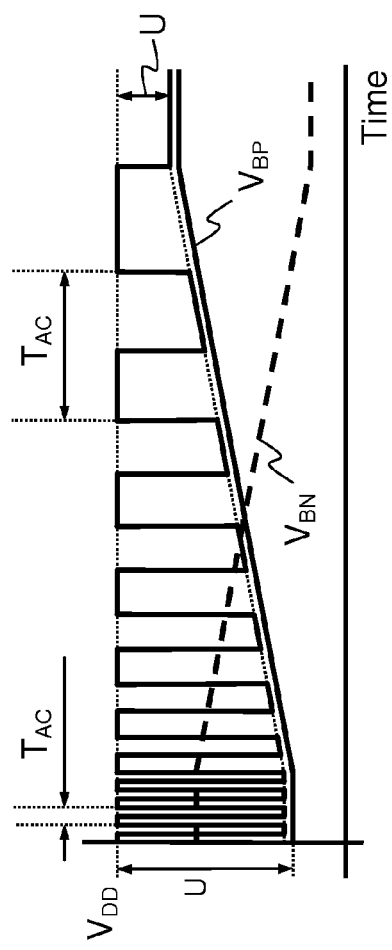
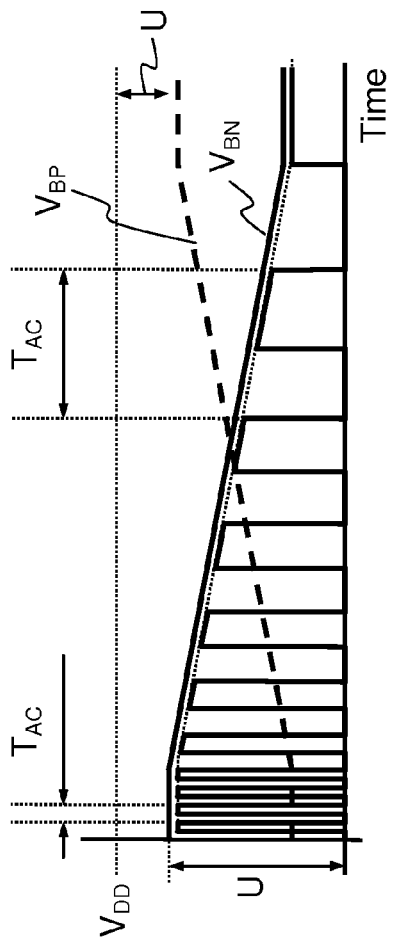
FIG. 5A (PRIOR ART)
FIG. 5B (PRIOR ART)

BIAS GENERATOR PROVIDING FOR LOW POWER, SELF-BIASED DELAY ELEMENT AND DELAY LINE

RELATED APPLICATIONS

The present application is a continuation application of U.S. patent application Ser. No. 12/621,983, filed Nov. 19, 2009, which is a divisional application of U.S. patent application Ser. No. 11/763,506, filed Jun. 15, 2007. Both related applications are hereby incorporated herein by reference in its entirety.

BACKGROUND OF THE INVENTION

A widely-used self-biased delay line is described in U.S. Pat. No. 5,772,037 and in John G. Maneatis, "Low-Jitter Process-Independent DLL and PLL Based on Self-Biased Technique", IEEE JSSC VOL. 31, No 11, November 1996, pp. 1723-1732 (hereinafter "Maneatis"). The self-biased delay line described in Maneatis apparently offers a number of advantageous features, such as high noise immunity, wide frequency range and low phase offset. The self-biased delay line uses a differential delay stage (also known as a "delay element") with a linearized, i.e., resistor-like, MOS-transistor load chain (see FIG. 4 in U.S. Pat. No. 5,727,037) and a bias voltage generator (FIG. 3 in U.S. Pat. No. 5,727,037) for controlling signal propagation delay time of the delay element.

While the self-biased delay line described in Maneatis provides superior performance, the self-biased delay line described in Maneatis may be improved by reducing power consumption, reducing sensitivity to operating conditions and reducing sensitivity to variation in process parameters.

SUMMARY

A bias generator presented herein improves on the bias generator described in Maneatis through the use of a reference voltage to generate the bias voltages such that, in at least some instances, the output of a biased delay element has a constant voltage swing. A delay line of such constant output voltage swing delay elements may be shown to provide reduced power consumption compared to the self-biased delay line described in Maneatis. Furthermore, in other cases, providing a reference current to a novel bias generator allows a delay line of delay elements biased by such a novel bias generator to show reduced sensitivity to operating conditions, reduced sensitivity to variation in process parameters and improved signal quality, thereby providing more robust operation.

In accordance with an example embodiment, there is provided a bias generator for biasing delay elements in a delay line employing one or more delay elements. The bias generator includes a bias generator variable resistance load element, the bias generator variable resistance load element connected between a power supply voltage and an intermediate node, a voltage-controlled current source for generating a reference current, a current mirror formed of a first side and a second side, the first side connected to the voltage-controlled current source so that current in the first side and current in the second side is established based on the reference current, a reference voltage generator for generating a reference voltage and an operational amplifier with a non-inverting input connected to the intermediate node, an inverting input connected to the reference voltage generator to receive the reference voltage and an output connected to control current in the bias generator variable resistance load element, wherein the operational amplifier adjusts the output to minimize a difference between voltage levels at the non-inverting input and the inverting input.

In accordance with another example embodiment, there is provided, at a bias generator, a method of controlling delay in delay elements in a delay line employing one or more delay elements. The method includes, while maintaining a constant alternating current voltage swing between a differential pair of output nodes of a given delay element, varying a first bias voltage, the first bias voltage controlling a rate at which a first output node of the differential pair of output nodes may charge and simultaneously varying a second bias voltage, in a manner inverse to a manner in which the first bias voltage is varied, the second bias voltage controlling a rate at which a second output node of the differential pair of output nodes may discharge.

In accordance with still another example embodiment, there is provided a bias generator for biasing delay elements in a delay line employing one or more delay elements. The bias generator includes a bias generator variable resistance load element, the bias generator variable resistance load element connected between a power supply voltage and an intermediate node, a voltage-controlled current source for generating a reference current, the voltage-controlled current source formed of a reference current generator supplying a reference current to a differential pair of field effect transistors (FETs), where division of the reference current between the pair of FETs is based on a reference voltage on a first branch and a control voltage on a second branch and a first current minor formed of a first side and a second side, the first side connected to the voltage-controlled current source so that current in the first side and current in the second side are established based on the division of the reference current.

In accordance with a further example embodiment, there is provided a self-biased delay element. The delay element comprising a reference voltage generator for generating a reference voltage, a bias generator coupled to the reference voltage generator to receive the reference voltage, the bias generator further receiving a control voltage and generating, based on the control voltage and the reference voltage, a first bias signal and a second bias signal and an element arranged to receive a differential input and generate a differential output, where the differential output lags the differential input by a delay, the element arranged to receive the first bias signal and the second bias signal and base the delay on the first bias signal and the second bias signal.

In accordance with an even further example embodiment, there is provided an apparatus for aligning a reference signal having a reference phase with a feedback signal having a feedback phase. The apparatus includes a phase comparator for comparing the reference phase and the feedback phase and for generating a phase comparator output signal that is proportional to a difference between the reference phase and feedback phase, a charge pump coupled to the phase comparator for generating a delay control voltage in response to the phase comparator output signal and a reference voltage generator for generating a reference voltage. The apparatus further includes a bias generator coupled to the loop filter for receiving the reference voltage and for generating, based on the delay control voltage: a first bias signal with a fixed relationship with the reference voltage; and a second bias signal with an inverse relationship to the first bias signal. The apparatus also includes a voltage-controlled element for receiving the reference signal and for generating the feedback signal having the feedback phase substantially aligned with the reference phase, wherein the first bias signal is configured to generate a first bias current in a first component of the voltage-controlled element and the second bias signal is configured to generate a second bias current in a second component of the voltage-controlled element.

BRIEF DESCRIPTION OF THE DRAWINGS

Reference will now be made to the drawings, which show by way of example, embodiments of the invention, and in which:

FIG. 5A illustrates a voltage waveform for the output of the delay element of FIG. 3 when biased by the bias generator of FIG. 2;

FIG. 5B illustrates a voltage waveform for the output of an inverted-polarity version of the delay element of FIG. 4 when biased by an inverted-polarity version of the bias generator of FIG. 3;

DETAILED DESCRIPTION OF THE EMBODIMENTS

Figure 1:
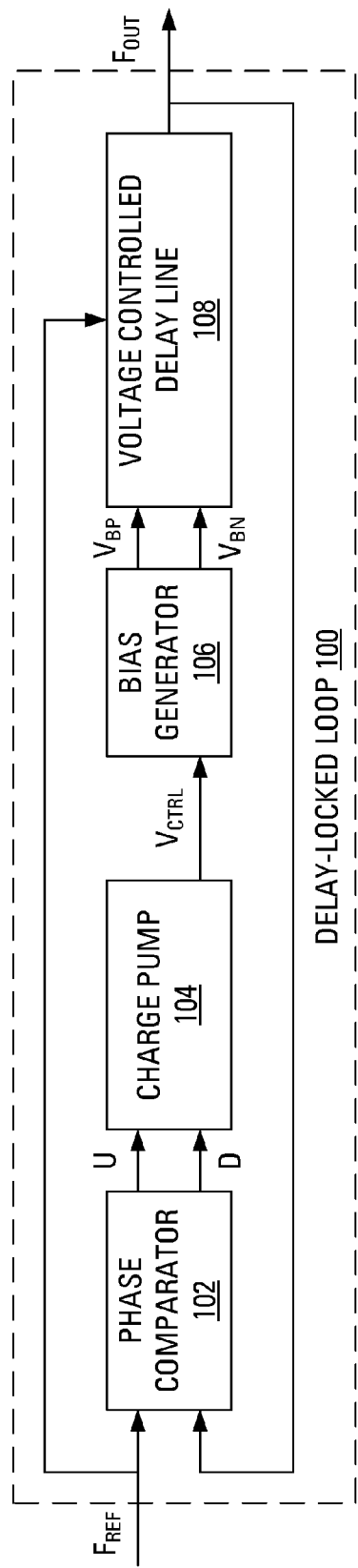
FIG. 1 shows a block diagram of a typical delay-locked loop including a voltage controlled delay line.

FIG. 1 presents a schematic illustration of a typical delay-locked loop (DLL) 100 as presented in Maneatis. Maneatis indicates that a self-biased DLL is constructed by taking advantage of the control relationship offered by a typical DLL. The typical DLL 100 includes a phase comparator 102, a charge pump 104, a loop filter (not explicitly shown), a bias generator 106 and voltage controlled delay line (VCDL) 108. The negative feedback in the loop adjusts the delay through the VCDL 108 by integrating the phase difference that results between a periodic reference input, $F_{REF}$, and output, $F_{OUT}$, from the VCDL 108. Once in lock, the VCDL 108 will delay the reference input, $F_{REF}$, by a fixed amount to form the VCDL output, $F_{OUT}$, such that there is, at least in theory, no detected phase difference between $F_{REF}$ and $F_{OUT}$.

In operation, the phase comparator 102 receives the AC reference signal, $F_{REF}$, and the AC output signal, $F_{OUT}$, and generates a control pulse signal indicative of a phase difference between $F_{REF}$ and $F_{OUT}$. Dependent upon whether $F_{OUT}$ is leading or lagging $F_{REF}$, the control pulse signal will appear as longer pulses on an "Up" line ("U") or a "Down" ("D") line of the phase comparator 102. Both the Up line and the Down line are received by the charge pump 104. The charge pump 104 receives the control pulse signal and provides, as output, a voltage control signal with a level called $V_{CTRL}$. The control signal is received by the bias generator 106, whose output is a bias voltage, $V_{BP}$, for PMOS transistors and a bias voltage, $V_{BN}$, for NMOS transistors. The two bias voltages, along with the AC reference signal, $F_{REF}$, are received by the voltage controlled delay line 108. The output of the VCDL 108 is the AC output signal, $F_{OUT}$.

Figure 2:
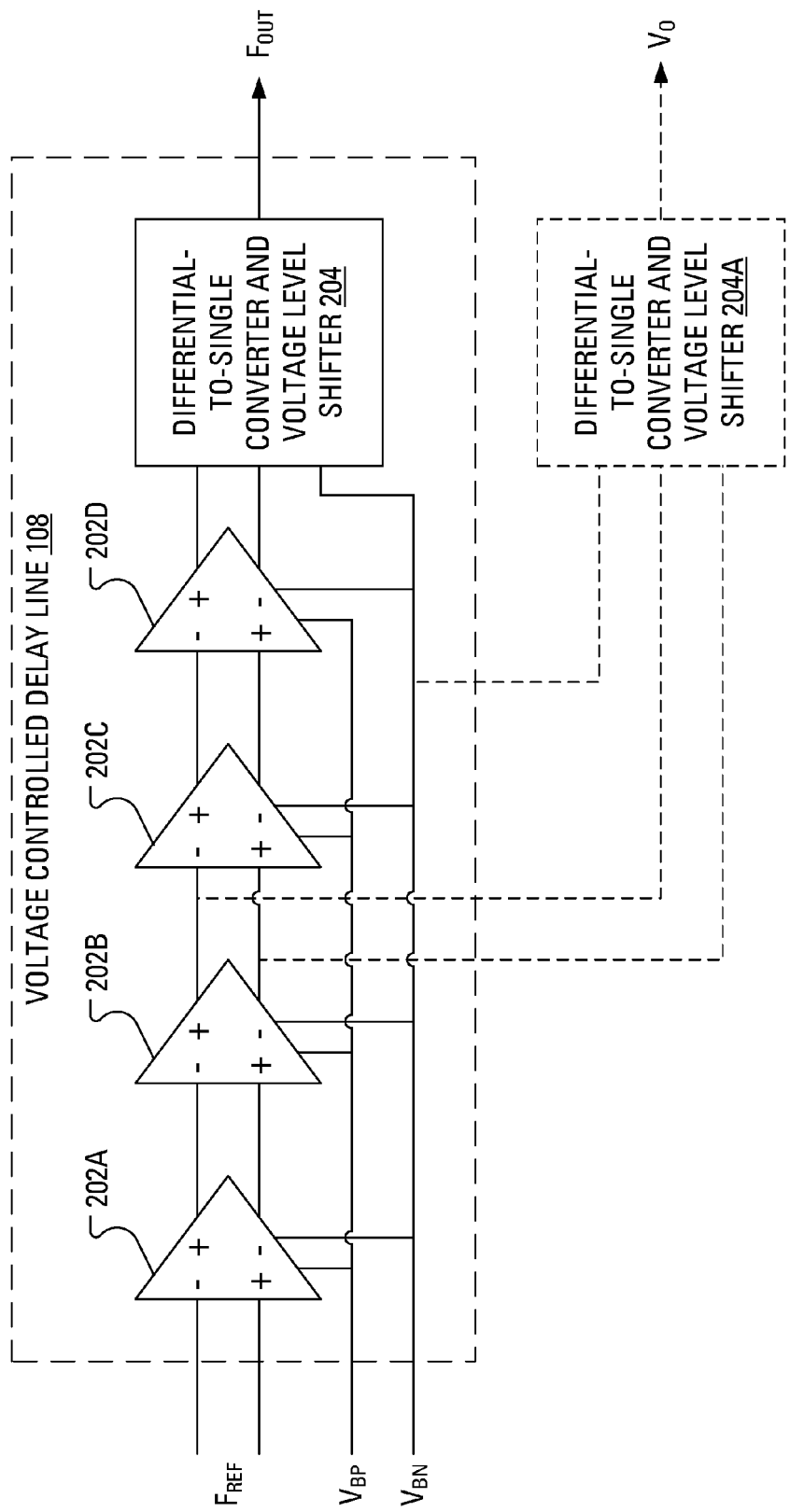
FIG. 2 illustrates, schematically and in diagrammatic form, an example structure for the voltage controlled delay line of FIG. 1, the example structure including a bias generator circuit and multiple delay elements.

FIG. 2 schematically illustrates an example structure for the VCDL 108. In particular, the VCDL 108 includes multiple delay elements 202A, 202B, 202C, 202D (individually or collectively, 202) connected in a series that is terminated in a differential-to-single converter and voltage level shifter 204. The differential input to the first delay element 202A is the reference signal, $F_{REF}$. The differential output of the first delay element 202A is received as differential input to the second delay element 202B. The differential output of the second delay element 202B is received as differential input to the third delay element 202C. The differential output of the third delay element 202C is received as differential input to the fourth delay element 202D. The differential output of the fourth delay element 202D is received as differential input to the differential-to-single converter and voltage level shifter 204. Each of the delay elements 202 receives bias voltages $V_{BN}$ and $V_{BP}$ from the bias generator 106. Additionally, the differential-to-single converter and voltage level shifter 204 receives bias voltage $V_{BN}$ from the bias generator 106. Notably, the example structure of FIG. 2 includes four delay elements 202 while, generally, the number of delay elements 202 is a design consideration and the number of delay elements 202 is in no way is limited. Indeed, the number of delay elements 202 may range from as few as one to as many as are deemed necessary.

While FIG. 2 illustrates $F_{REF}$ as a differential input to the VCDL 108, $F_{REF}$ may be supplied to the DLL 100 as a single input, in which case a single-to-differential converter may be required before the input to the VCDL 108.

Traditionally, voltage controlled delay lines have suffered from variations related to the process used to manufacture the transistors employed therein and variability in operating conditions.

Maneatis suggested the bias generator 106 to provide the bias voltages $V_{BP}$ and $V_{BN}$. Maneatis notes that the AC signal in the VCDL 108 has a variable voltage swing, which changes with the frequency of the AC signal (corresponding to delay produced by the delay line).

Figure 3:
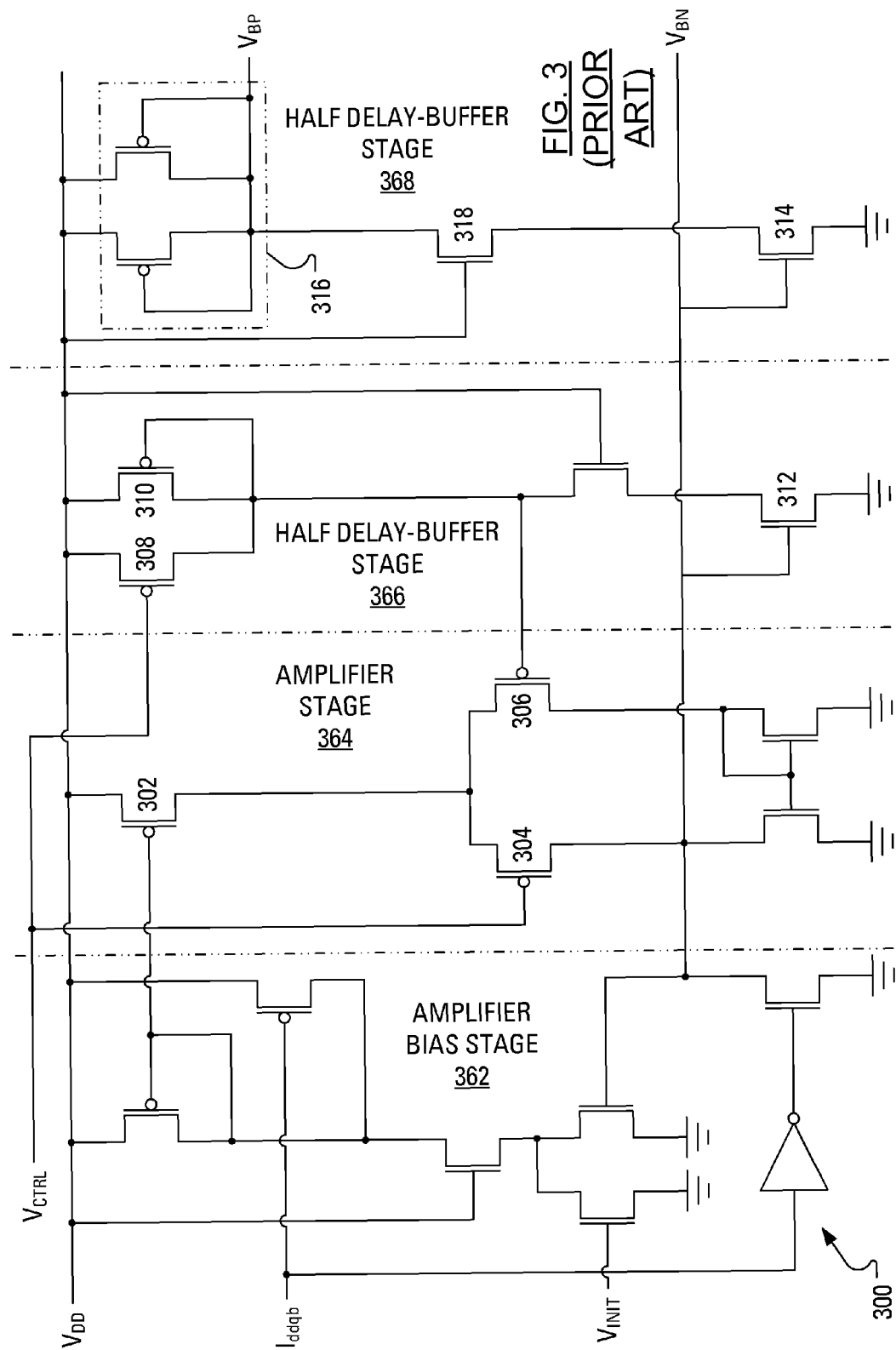
FIG. 3 illustrates a prior art structure for the bias generator circuit of FIG. 2.

FIG. 3 illustrates a prior art structure for a bias generator 300 that has been used for the bias generator 106 in the DLL 100 of FIG. 1. The bias generator 300 is illustrated in FIG. 3 as including four stages: an amplifier bias stage 362; an amplifier stage 364; a first half delay-buffer stage 366; and a second half delay-buffer stage 368. The amplifier bias stage 362 generates signals to appropriately bias the components of the amplifier stage 364. The amplifier stage 364 includes a first PMOS transistor 302, a second PMOS transistor 304 and a third PMOS transistor 306.

The amplifier stage 364 is set up in a negative feedback configuration. As a result, the amplifier stage 364 attempts to equate the voltages appearing at the gates of the second PMOS transistor 304 and the third PMOS transistor 306. The voltage at the gate of the second PMOS transistor 304 is $V_{CTRL}$. Thus, the amplifier stage 364 attempts to make the voltage at the gate of the third PMOS transistor 306 equal to $V_{CTRL}$.

The first half delay buffer stage 366 has a symmetric load element formed by a first PMOS load element transistor 308 and a second PMOS load element transistor 310 and has a first current source transistor 312.

The second delay buffer stage 368 has a symmetric load element 316 similar to the symmetric load element formed by the first PMOS load element transistor 308 and the second PMOS load element transistor 310. In this case however, current in the symmetric load element 316 is controlled by a second current source transistor 314, which has been biased by the bias voltage $V_{BN}$. Between, and in series with the symmetric load element 316 and the second current source transistor 314 is an intermediate transistor 318 with a gate connected to the power supply voltage $V_{DD}$.

The combination of the symmetric load element 316 and the symmetric load element formed by the first PMOS load element transistor 308 and the second PMOS load element transistor 310 form a symmetric load.

The voltage at the gate of transistor 306 is the output of the first half-delay buffer stage 366. The output of the first half delay buffer stage 366 is generated by the first current source transistor 312. The symmetric load element acts as a variable resistance that varies linearly as $V_{CTRL}$ varies. Thus, the amplifier adjusts the first current source transistor 312 until it sources sufficient current to cause the voltage at the gates of the second PMOS transistor 304 and the third PMOS transistor 306 to be equal. The value on the drain of the second PMOS transistor 304 is the bias voltage $V_{BN}$. As will be understood from a thorough reading of Maneatis, the proper value for the bias voltage $V_{BN}$ is a value that makes the output of the half delay buffer stage 366 equal $V_{CTRL}$.

The output of the amplifier stage 364 biases the second current source transistor 314 in the second half-delay buffer stage 368. The symmetric load element 316 is controlled by the second current source transistor 314 which is biased by the bias voltage $V_{BN}$. As a result, the second half-delay buffer stage 368 produces an output voltage nominally equal to $V_{CTRL}$. This output voltage value is used as the bias voltage $V_{BP}$.

The example VCDL 108 of FIG. 2 has two bias inputs, a reference input and one output. The bias voltage $V_{BP}$ is a version of the delay control voltage $V_{CTRL}$ that has been buffered by the known bias generator 300. The bias voltage $V_{BP}$ controls the frequency of the output of the VCDL 108 by controlling a resistance in symmetric loads in each of the delay elements 202. In this manner, the output, $F_{OUT}$, of the DLL 100 is delay-locked to the reference input, $F_{REF}$. That is, the output, $F_{OUT}$, of the VCDL 108 is a delay-locked output signal. The output signal has a frequency which is delay-locked to the frequency $F_{REF}$, of the input to DLL 100.

Figure 4:
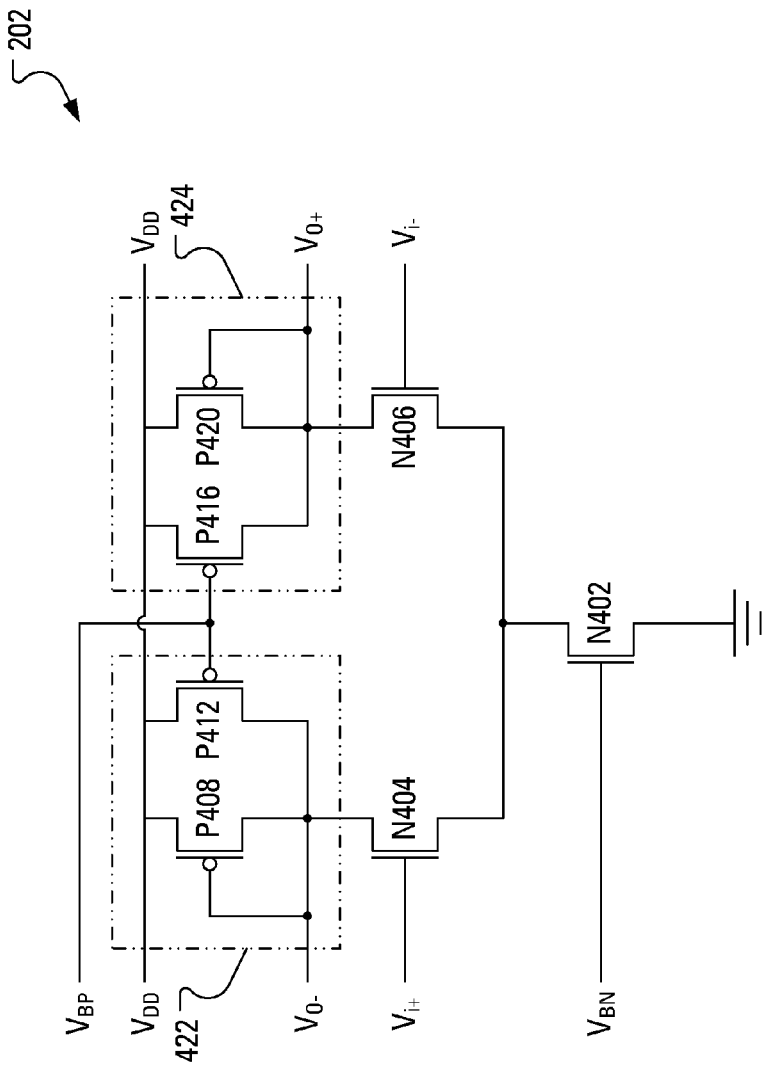
FIG. 4 illustrates a prior art structure for one of the delay elements of FIG. 2.

The VCDL 108 comprises multiple delay elements 202. A structure for one of the delay elements 202 is shown in FIG. 4, according to Maneatis. Starting from the bottom, the delay element 202 includes a lower NMOS transistor N402. The source of the lower NMOS transistor N402 is connected to ground. The gate of the lower NMOS transistor N402 is connected to a $V_{BN}$ node. The drain of the lower NMOS transistor N402 is connected to two paths: a left path; and a right path.

The left path includes a left NMOS input transistor N404. The source of the left NMOS input transistor N404 is connected to the drain of the lower NMOS transistor N402. The gate of the left NMOS input transistor N404 is connected to an input node, $V_{i+}$, for receiving a portion of the differential input reference voltage, $V_{REF}$. The drain of the left NMOS input transistor N404 is connected to an output node, $V_{O-}$. The output node $V_{O-}$ is also connected to the drain of a left first PMOS load element transistor P408 and to the drain of a left second PMOS load element transistor P412. The gate of the left first PMOS load element transistor P408 is connected to the output node $V_{O-}$. The gate of the left second PMOS load element transistor P412 is connected to a $V_{BP}$ node. The sources of the left PMOS load element transistors P408, P412 are connected to the voltage source $V_{DD}$. Together, the left PMOS load element transistors P408, P412 make up a left symmetric load 422.

The right path includes a right NMOS input transistor N406. The source of the right NMOS input transistor N406 is connected to the drain of the lower NMOS transistor N402. The gate of the right NMOS input transistor N406 is connected to an input node, $V_{i-}$, for receiving a portion of the differential input reference voltage, $V_{REF}$. The drain of the right NMOS input transistor N406 is connected to an output node, $V_{O+}$. The output node $V_{O+}$ is also connected to the drain of a right first PMOS load element transistor P420 and to the drain of a right second PMOS load element transistor P416. The gate of the right first PMOS load element transistor P420 is connected to the output node $V_{O+}$. The gate of the right second PMOS load element transistor P416 is connected to the $V_{BP}$ node. The sources of the right PMOS load element transistors P420, P416 are connected to the voltage source $V_{DD}$. Together, the right PMOS load element transistors P420, P416 make up a right symmetric load 424.

In operation of the delay element 202 illustrated in FIG. 4, the lower NMOS transistor 402 is biased by the bias voltage $V_{BN}$. The left symmetric load 422 functions as a variable resistor network. The left symmetric load 422 outputs a current as a function of the voltage on the output node $V_{O-}$, which voltage varies symmetrically about the voltage $0.5*V_{CTRL}$. The right symmetric load 424 also functions as a variable resistor network. The right symmetric load 424 outputs a current as a function of the voltage on the output node $V_{O+}$, which voltage varies symmetrically about the voltage $0.5*V_{CTRL}$.

In particular, when the voltage at the input node $V_{i+}$ is at a logical high voltage, the left NMOS input transistor N404 is ON and the channel of the left NMOS input transistor N404 is conducting, allowing any charge that has built up on the output node $V_{O-}$ to discharge through the left NMOS input transistor N404 and the lower NMOS transistor N402. The speed of the transition of the output node $V_{O-}$ from charged to discharged is related to the extent to which the channel in the lower NMOS transistor N402 is conducting, which extent is controlled by the bias voltage $V_{BN}$.

In the known bias generator 300 of FIG. 3, the combination of the PMOS load element transistors in the symmetric load element 316, the intermediate transistor 318 and the current source transistor 314 is designed, in part, to mimic the combination of the left first PMOS load element transistor P408, the left second PMOS load element transistor P412, the left NMOS input transistor N404 and the lower NMOS transistor N402. The voltage on the drain and the gate of both of the PMOS load element transistors in the symmetric load element 316 is determined based on the voltage, $V_{BN}$, on the gate of the current source transistor 314. When the voltage at the input node $V_{i+}$ is at a logical high voltage, the left NMOS input transistor N404 is biased in a manner identical to the manner in which the intermediate transistor 318 is permanently biased. Furthermore, the lower NMOS transistor N402 is biased with bias voltage $V_{BN}$ in a manner identical to the manner in which the current source transistor 314 is biased. Accordingly, when the voltage at the input node $V_{i+}$ is at a logical high voltage, the charge on the output node $V_{O-}$ may only discharge until the voltage on the output node $V_{O-}$ (i.e., the voltage on the drain and the gate of the left first PMOS load element transistor P408) is equal to the voltage on the drain and the gate of both of the PMOS load element transistors in the symmetric load element 316, that is, the bias voltage $V_{BP}$.

Simultaneously, the input node $V_{i-}$ is at a logical low voltage. Accordingly, the right NMOS input transistor N406 is OFF and the channel of the right NMOS input transistor N406 is not conducting, thereby allowing a charge build up on the output node $V_{O+}$, through the right symmetric load 424, to a value close to the supply voltage $V_{DD}$. The speed of the transition of the output node $V_{O+}$ from discharged to charged is related to the extent to which the channel in the right second PMOS load element transistor P416 is conducting, which extent is controlled by the bias voltage $V_{BP}$.

Subsequently, when the voltage at the input node $V_{i+}$ switches to a logical low voltage, the left NMOS input transistor N404 turns OFF and the channel of the left NMOS input transistor N404 stops conducting, thereby allowing a charge to build up again on the output node $V_{O-}$. The output node $V_{O-}$ charges, through the left symmetric load 422, to a value close to the supply voltage $V_{DD}$. The speed of the transition of the output node $V_{O-}$ from discharged to charged is related to the extent to which the channel in the left second PMOS load element transistor P412 is conducting, which extent is controlled by the bias voltage $V_{BP}$.

Simultaneously, the input node $V_{i-}$ switches to a logical high voltage. Accordingly, the right NMOS input transistor N406 turns ON and the channel of the right NMOS input transistor N406 begins conducting, thereby allowing the output node $V_{O+}$ to discharge through the right NMOS input transistor N406 and the lower NMOS transistor N402. The speed of the transition of the output node $V_{O+}$ from charged to discharged is related to the extent to which the channel in the lower NMOS transistor N402 is conducting, which extent is controlled by the bias voltage $V_{BN}$.

As discussed above in relation to the voltage at the input node $V_{i+}$ being at a logical high voltage, when the voltage at the input node $V_{i-}$ is at a logical high voltage, the charge on the output node $V_{O+}$ may only discharge until the voltage on the output node $V_{O+}$ (i.e., the voltage on the drain and the gate of the right first PMOS load element transistor P420) is equal to the voltage on the drain and the gate of both of the PMOS load element transistors in the symmetric load element 316, that is, the bias voltage $V_{BP}$.

One of ordinary skill in the art will appreciate that, as the bias voltage $V_{BP}$ changes (i.e., as the charge pump 104 changes $V_{CTRL}$ in response to phase tracking adjustments received from the phase comparator 102) the resistivity of the symmetric loads 422, 424 also change. Such a change in the resistivity of the symmetric loads 422, 424 directly controls the frequency of the output voltage, $V_O$, by changing the delay of the signal through the delay element 202.

A waveform voltage at the differential output ($V_{O+}/V_{O-}$) of the delay element 202 illustrated in FIG. 4, when bias voltages $V_{BN}$ and $V_{BP}$ are provided by the known bias generator 300, is shown in a simplified form in FIG. 5A. AC signal voltage swing in this, first, example is from a higher voltage level of the supply voltage $V_{DD}$ to a lower voltage level. The lower voltage level closely follows the bias voltage $V_{BP}$. By reviewing the waveform, one learns that a decrease in the AC signal frequency corresponds to an increase in the bias voltage $V_{BP}$ and a decrease in the bias voltage $V_{BN}$. A decrease in the AC signal frequency corresponds to an increase in the delay provided by the VCDL 108, a longer AC signal period, $T_{AC}$, and a decrease in the AC voltage swing. The range of swing variation over an operational frequency range for this kind of delay line may be hundreds of millivolts, that is, from 20-30% to almost 100% of the value of the supply voltage $V_{DD}$.

A waveform is shown in FIG. 5B for an "inverted polarity" version of the delay element 202 with the structure as illustrated in FIG. 4. If the delay element 202 is built with PMOS transistors in place of NMOS transistors and with NMOS transistors in place of PMOS transistors, it is anticipated that the AC signal voltage swing will be from a lower voltage level of the supply voltage $V_{SS}$ to a higher voltage level close to the bias voltage $V_{BN}$. A decrease in the frequency of the AC signal corresponds to a longer AC signal period, $T_{AC}$, and to a decrease in the AC voltage swing. The correspondence between a decrease in the frequency of the AC signal and a decrease in the AC voltage swing is found in the example waveforms in both FIG. 5A and FIG. 5B.

In a prior art DLL 100 using the known bias generator 300 for the bias generator 106 and delay elements 202 with the structure as illustrated in FIG. 4, reducing delay (that is increasing frequency) is achieved by lowering the voltage level at the $V_{CTRL}$ node. As the voltage level at the $V_{CTRL}$ node is lowered (i.e., made closer to ground), the bias voltage generator 106 responds by simultaneously increasing the voltage level at node $V_{BN}$ and decreasing the voltage level at the $V_{BP}$ node. The voltage level at the $V_{BP}$ node closely follows the voltage level of the control voltage node of $V_{CTRL}$. In operation, the voltage swing of the AC signal in the delay element 202, when biased by the known bias generator 300, is between a voltage level very close to the power supply voltage $V_{DD}$ as the higher and the bias voltage $V_{BP}$ as the lower. Consequently, voltage swing of the AC signal in the VCDL 108 increases as the signal frequency increases (see FIGS. 5A and 5B).

AC signal propagation delay (or frequency) in the VCDL 108, when biased by the known bias generator 300, is determined by node capacitances of nodes $V_{O-}$ and $V_{O+}$, which capacitances are charged by currents of transistors 408, 412, 416, 420 to the voltage level $V_{DD}$ and discharged by currents in the left NMOS input transistor N404 and the right NMOS input transistor N406 to the bias voltage $V_{BP}$.

Since the voltage difference between the power supply voltage $V_{DD}$ and the bias voltage $V_{BP}$ in the VCDL 108, when biased by the known bias generator 300, changes simultaneously and in accordance with the bias voltage $V_{BN}$, one might approximate both the bias voltage $V_{BN}$ and the voltage drop ($V_{DD}-V_{BP}$) as U, where U is the AC signal voltage swing in this delay line. The voltage drop ($V_{DD}-V_{BP}$) determines the currents of the charging transistors (i.e., the left first PMOS load element transistor P408, the left second PMOS load element transistor P412, the right first PMOS load element transistor P420 and the right second PMOS load element transistor P416) while the bias voltage $V_{BN}$ determines the currents of the discharging transistors (i.e., the left NMOS input transistor N404 and the right NMOS input transistor N406). The known bias generator 300 tends to equalize the charging current and the discharging current. Such equalization acts to provide a steady lower voltage swing level ($V_{BP}$) for the AC signal and to provide a transition time for rising ramps of the AC signal equal to a transition time for falling ramps of the AC signal. Accordingly, both currents may be expressed as $I=k(U-V_t)^2$. That is, the currents may be expressed in the manner of a channel current of a "general" MOS transistor with trans-conductance coefficient k and a threshold voltage $V_t$.

The AC signal transition time, which determines the propagation delay and frequency of the AC signal, may be expressed as $$T_d = C\frac{U}{I},$$

where C is the node capacitance of the nodes $V_{O-}$, $V_{O+}$. Substituting for I gives $$T_d = C\frac{U}{k(U-V_t)^2}. \quad (1.1)$$

While the expression in equation (1.1) does not accurately describe the delay in the delay element 202 with the structure as illustrated in FIG. 4, the expression in equation (1.1) does help one to understand a problem of the structure as illustrated in FIG. 4. As the frequency increases (corresponding to $T_d$ decreasing), the value of U also increases. Looking again at approximation represented by equation (1.1), it may be seen that, with the AC signal voltage swing U increasing, the current I has to increase even faster (with the rate of $U^2$). One might say that current, in the delay element 202 with the structure as illustrated in FIG. 4, has to chase and overrun the voltage swing U, resulting in an inefficient power scheme. Moreover, in modern submicron processes, the quadratic equation for current value, $I=k(U-V_t)^2$, does not hold over the entire voltage range of $V_{SS}$ to $V_{DD}$. Examination of the MOS transistor characteristic in a submicron process shows that the MOS transistor channel current may be described by the "classic" quadratic expression only for the gate-source voltages close to $V_t$, that is, for small channel currents. As the gate-source voltage surpasses a value somewhere between $V_t$ and $V_{DD}$, a plot of the channel current as a function of the gate-source voltage looks very close to straight line, suggesting that an approximation for the channel current I may be better expressed in the form I=aU+b. Substituting for I in the $T_d$ expression one more time gives $$T_d = C\frac{U}{aU+b}. \quad (1.2)$$

Equation (1.2) includes a linear expression of U in both the numerator and the denominator. Accordingly, when increasing U (say, in an attempt to increase frequency and, correspondingly, to reduce $T_d$), with both the numerator and the denominator changing at the same rate, one should expect a relatively smaller change of $T_d$ for the larger values of U. In other words, lowering the delay control voltage $V_{CTRL}$ below a certain level will pump more current into the delay elements 202, when biased by the known bias generator 106, with a relatively smaller payoff measured as a reduction of $T_d$. It may be considered, then, that a DLL using the known bias generator 300 for the bias generator 106 loses efficiency at larger values of U, corresponding to higher frequencies.

Furthermore, while reviewing the known bias generator 300 one might conclude that, initially, the value of the charging currents and the value of the discharging currents are set by the channel current of the first PMOS load element transistor 308 and the second PMOS load element transistor 310 and that the channel current of the first PMOS load element transistor 308 and the second PMOS load element transistor 310 changes with the delay control voltage $V_{CTRL}$. However, as is known, MOS transistor parameters vary with temperature, power supply voltage and process parameters. As changes occur in the value of the trans-conductance coefficient k and the value of the threshold voltage $V_t$ for the transistors, it is expected that changes will also occur in the voltage value of the delay control voltage $V_{CTRL}$ for an operating point at a given AC signal frequency. A consequence of these changes is a change (a broadening) in the dynamic voltage range of $V_{CTRL}$ over which the known bias generator 300 is expected to operate, especially when handling a broad range of frequencies. Such a broadening of the dynamic voltage range might not have been critical in systems developed for 0.5 µm processes with $V_{DD}$ voltage about and above 2.0V. However, as submicron processes now offer $V_{DD}$ voltage levels about and below 1.0V, every millivolt in reduction of the dynamic range of the delay control voltage $V_{CTRL}$ is helpful.

In a prior art DLL 100 using the known bias generator 300 for the bias generator 106 and delay elements 202 with the structure as illustrated in FIG. 4, as the frequency is reduced, the swing U also decreases (see FIG. 5A). Notably, the swing U may be reduced to a relatively small value (e.g., 200 mV or less). Restoration, for instance, through use of the differential-to-single converter and voltage level shifter 204 (FIG. 2), of a signal having such a small swing U to a signal having a full swing (from $V_{SS}$ to $V_{DD}$) is expected to add complexity, increase silicon area use and increase power consumption of the prior art system. Eventually, as attempts are made to further reduce the swing U, it is expected that a limit to further frequency reduction will be found, i.e., a minimum frequency of operation.

The known bias generator 300, as illustrated in FIG. 3, has a differential amplifier stage 364 including the first PMOS transistor 302, the second PMOS transistor 304 and the third PMOS transistor 306. The amplifier stage 364 in the form illustrated in FIG. 3 is expected to further reduce the dynamic voltage range for the delay control voltage $V_{CTRL}$, since the amplifier stage 364 will not operate for values of the delay control voltage $V_{CTRL}$ that are above $V_{DD}-V_t$. Even if a rail-to-rail differential amplifier were to be used for the amplifier stage 364, the rail-to-rail differential amplifier, because it is an analog stage in the feedback loop of the known bias generator 300, will add to the complexity of providing dynamic stability to the bias generator 106 and to the DLL 100 as a whole. Furthermore, the known bias generator 300 is a system with feedback. Accordingly, the known bias generator 300 may be considered more difficult to design relative to a bias generator not having feedback. Additionally, comparing a bias generator with feedback to a bias generator without feedback, the bias generator with feedback may be considered more difficult to stabilize or to migrate from one production process to another.

Figure 6:
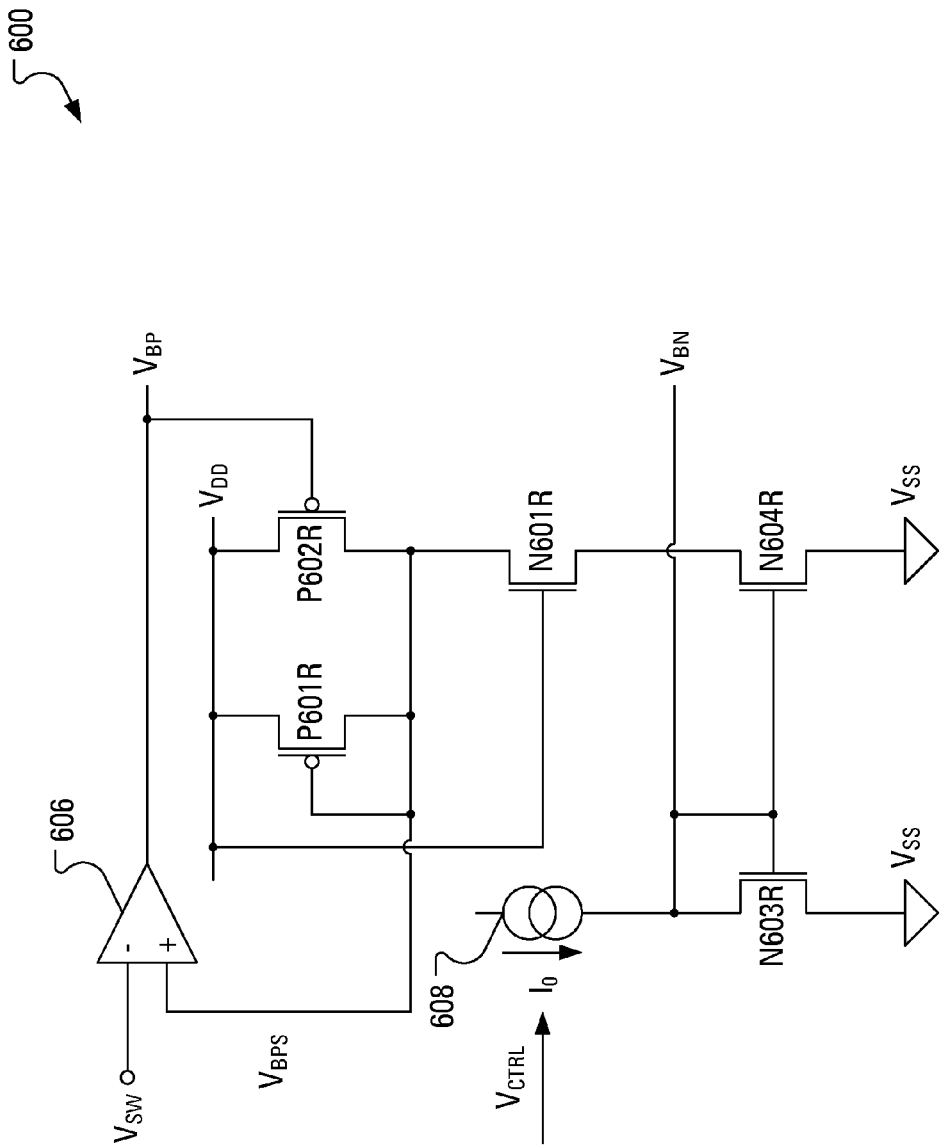
FIG. 6 illustrates a bias generator according to a first example embodiment.

FIG. 6 schematically illustrates a first bias generator 600 suited for use with the delay element 202 having the structure as illustrated in FIG. 4. As shown, from the bottom up, the first bias generator 600 includes a current mirror made up of a first NMOS minor transistor N603R and a second NMOS minor transistor N604R. The sources of the NMOS minor transistors N603R, N604R are connected to a voltage source $V_{SS}$. The gates of the NMOS minor transistors N603R, N604R are connected to each other and to the drain of the first NMOS minor transistor N603R. The drain of the first NMOS mirror transistor N603R is also connected to a $V_{BN}$ node, i.e., a node from which the NMOS bias voltage $V_{BN}$ is provided to the delay elements 202. The $V_{BN}$ node receives a reference current, $I_0$, generated by a current source 608 based on the delay control voltage $V_{CTRL}$. In one implementation, the current source 608 is a MOS transistor current with the delay control voltage $V_{CTRL}$ being the MOS transistor gate-source voltage.

For ease of illustration, the current mirror shown is of a basic type. It should be clear that other, more complicated, designs are available for the current minor are possible. For instance, it might be possible to have a current mirror that included a programmable array of transistors, the array being programmed by the chip manufacturer at time of testing. Alternatively, a current mirror built of cascoded devices my be used.

The drain of the second NMOS mirror transistor N604R is connected to the source of an intermediate NMOS transistor N601R. The gate of the intermediate NMOS transistor N601R is connected to a voltage source $V_{DD}$ and the drain of the intermediate NMOS transistor N601R is connected to an intermediate node, labeled "$V_{BPS}$". The $V_{BPS}$ node is connected to the drain of a first PMOS load element transistor P601R and to the drain of a second PMOS load element transistor P602R. The sources of the PMOS load element transistors P601R, P602R are connected to the voltage source $V_{DD}$. The gate of the second PMOS load element transistor P602R is connected to a $V_{BP}$ node, i.e., a node from which the PMOS bias voltage $V_{BP}$ is provided to the delay elements 202. The gate of the first PMOS load element transistor P601R is connected to the $V_{BPS}$ node. The $V_{BPS}$ node is connected to the non-inverting input of a differential amplifier 606, whose output is connected to the $V_{BP}$ node.

The first PMOS load element transistor P601R, the second PMOS load element transistor P602R, the intermediate NMOS transistor N601R, the second NMOS minor transistor N604R and the first NMOS minor transistor N603R are all straight or scaled replicas (similarly sized or scaled) of the counterpart transistors of the delay element 202, including the left first PMOS load element transistor P408, the left second PMOS load element transistor P412, the left NMOS input transistor N404, the right first PMOS load element transistor P420, the right second PMOS load element transistor P416, the right NMOS input transistor N406 and the lower NMOS transistor 402.

Figure 7:
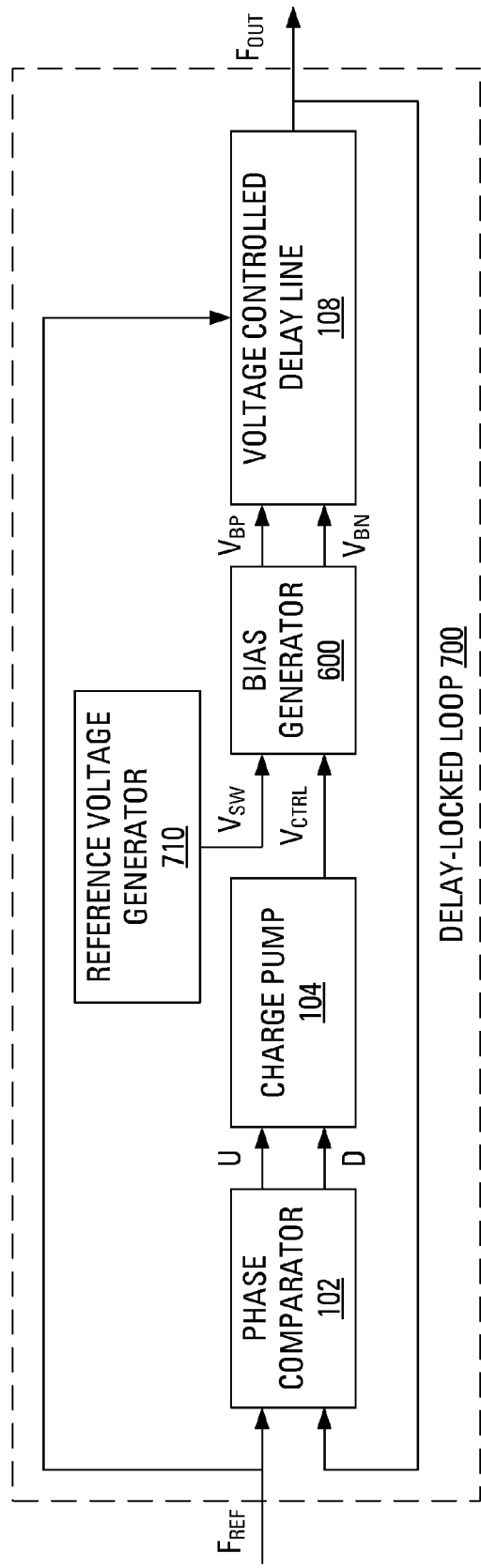
FIG. 7 shows a block diagram of a delay-locked loop including the bias generator of FIG. 6 and a voltage controlled delay line.

As the first bias generator 600 has a structure distinct from the known bias generator 300, a DLL employing the first bias generator 600 will have a structure distinct from the DLL 100 of FIG. 1. An example DLL 700 employing the first bias generator 600 is illustrated in FIG. 7. In contrast to the DLL 100 of FIG. 1, the example DLL 700 of FIG. 7 includes a reference voltage generator 710 adapted to provide the first bias generator 600 with a reference voltage $V_{SW}$.

Since the reference voltage generator 710 is not a subject of this invention, implementation details are not discussed here. However, it is anticipated that the skilled practitioner will appreciate that an adequate reference voltage generator scheme can be chosen from among a number of known reference voltage generator schemes commonly used in the industry. It is notable that a scheme may be selected for the reference voltage generator 710 so that the voltage level $V_{SW}$ is stable in that the voltage level $V_{SW}$ does not vary with variations in operating conditions (e.g., temperature and/or variations in process parameters). Alternatively, a scheme may be selected for the reference voltage generator 710 so that the value the voltage level $V_{SW}$ has a certain dependence on the temperature and/or on process parameters. Where the voltage level $V_{SW}$ is provided with such a dependence, the reference voltage generator 710 may be seen as compensating for variations in operating conditions and in process parameters, which variations may exert an influence on parameters (e.g., the value of the delay control voltage $V_{CTRL}$ at the operating point) that affect the operation of the bias voltage generator 600.

Figure 8:
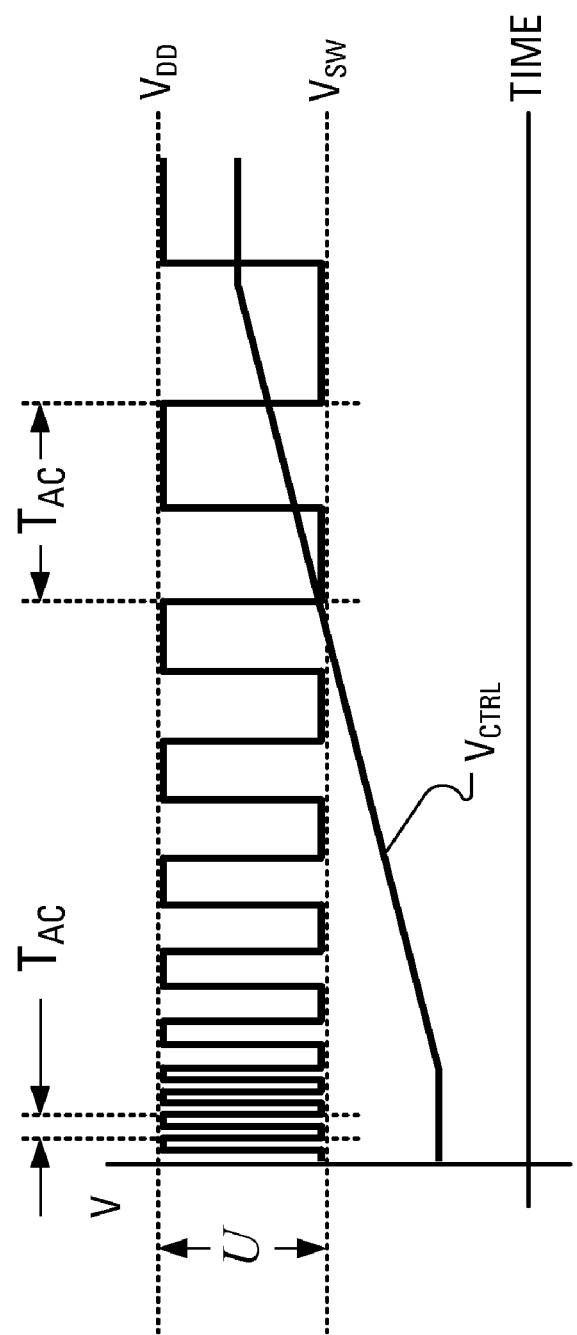
FIG. 8 illustrates a voltage waveform for the output of the delay element of FIG. 4 when biased by the bias generator of FIG. 6.

In overview, use of a bias generator such as the first bias generator 600 illustrated in FIG. 6 provides for a consistent voltage swing U in the VCDL 108 and, in particular, in the delay element 202 with the structure as illustrated in FIG. 4. FIG. 8 illustrates such a consistent voltage swing U as having a higher level of $V_{DD}$ and a lower level of $V_{SW}$, where $V_{SW}$ is the voltage level supplied to the first bias generator 600 by the reference voltage generator 710. More particularly, $V_{SW}$ is the voltage level received at the inverting input of the differential amplifier 606. An impact of this consistent voltage swing U, i.e., a voltage swing that does not change as the frequency of the AC signal changes, include lower current consumption in the delay element 202 at higher frequencies of the AC signal and a lower minimum frequency of operation, when compared to operation of the delay element 202 as biased by the known bias generator 300.

During the operation of the first bias generator 600, it will become clear that the reference current $I_0$ is a delay-controlling current. The magnitude of the delay-controlling current $I_0$ is controlled by the value of the delay control voltage $V_{CTRL}$ received by the first bias generator 600 from the charge pump 104 (see FIG. 1), perhaps via a loop filter (not shown). The current source 608 injects the delay-controlling current $I_0$ into the $V_{BN}$ node. The delay-controlling current $I_0$ flowing through the first NMOS mirror transistor N603R is mirrored in the second NMOS minor transistor N604R. It follows that the current in the intermediate NMOS transistor N601R also minors the delay-controlling current $I_0$. The current in the intermediate NMOS transistor N601R is split between the PMOS load element transistors P601R, P602R.

Furthermore, the voltage level $V_{SW}$, which is received from the reference voltage generator 710, is applied to a $V_{SW}$ node connected to the inverting input of the differential amplifier 606. Output of the differential amplifier 606 drives the gate of the second PMOS load element transistor P602R to the PMOS bias voltage $V_{BP}$ so that the delay-controlling current $I_0$, after having passed through the current mirror formed by the NMOS minor transistors N603R, N604R, is balanced by the collective current of the PMOS load element transistors P601R, P602R. In this manner, the quiescent voltage level at the $V_{BPS}$ node follows closely the quiescent voltage level at the $V_{SW}$ node. Notably, the quiescent voltage level at the $V_{SW}$ node determines the lower level of the AC signal voltage swing.

Recall that the output of the first bias generator 600 of FIG. 6 includes a bias voltage, $V_{BP}$, for PMOS transistors and a bias voltage, $V_{BN}$, for NMOS transistors, where the transistors are part of the delay elements 202 (see FIG. 4) in the VCDL 108 (see FIG. 7).

In operation of the delay element 202 illustrated in FIG. 4, as biased by the first bias generator 600 of FIG. 6, when the voltage at the input node $V_{i+}$ is at a logical high voltage, the left NMOS input transistor N404 is ON and the channel of the left NMOS input transistor N404 is conducting, allowing any charge that has built up on the output node $V_{O-}$ to discharge through the left NMOS input transistor N404 and the lower NMOS transistor N402. The speed of the transition of the output node $V_{O-}$ from charged to discharged is related to the extent to which the channel in the lower NMOS transistor N402 is conducting, which extent is controlled by the bias voltage $V_{BN}$.

If the delay-controlling current $I_O$ increases, corresponding to a change (variation) in the delay control voltage $V_{CTRL}$, then the gate to source voltage of the first NMOS minor transistor N603R (i.e., the bias voltage $V_{BN}$) also increases. Additionally, the current increases in the second NMOS minor transistor N604R, the intermediate NMOS transistor N601R and the PMOS load element transistors P601R, P602R, mirroring the increase in the delay-controlling current $I_O$. The increase in current in the first PMOS load element transistor P601R leads to an increase in the source to gate voltage, which increase is associated with a decrease in the voltage level at the $V_{BPS}$ node. The differential amplifier 606 reduces the voltage level at the $V_{BP}$ node so that the voltage level at the $V_{BPS}$ node returns to the quiescent voltage level at the $V_{SW}$ node. In this manner, an increase in the delay-controlling current $I_O$ leads to an increase in the bias voltage $V_{BN}$ and a decrease in the bias voltage $V_{BP}$. Under the converse conditions, a similar analysis applies, that is, a decrease in the delay-controlling current $I_O$ leads to a decrease in the bias voltage $V_{BN}$ and to an increase in the bias voltage $V_{BP}$. In either case, the voltage level at the $V_{BPS}$ node remains close to the quiescent voltage level at the $V_{SW}$ node.

In the first bias generator 600 of FIG. 6, the combination of the first PMOS load element transistor P601R, the second PMOS load element transistor P602R, the intermediate NMOS transistor N601R and the second NMOS minor transistor N604R is designed, in part, to mimic the combination of the left first PMOS load element transistor P408, the left second PMOS load element transistor P412, the left NMOS input transistor N404 and the lower NMOS transistor N402. The voltage level at the $V_{BPS}$ node is determined based on the differential amplifier 606 acting to minimize the difference between the voltage level at the $V_{BPS}$ node and voltage level at the $V_{SW}$ node.

When the voltage at the input node $V_{i+}$ is at a logical high voltage, the left NMOS input transistor N404 is biased in a manner identical to the manner in which the intermediate NMOS transistor N601R is permanently biased. Furthermore, the lower NMOS transistor N402 is biased with bias voltage $V_{BN}$ in a manner identical to the manner in which the second NMOS minor transistor N604R is biased. Accordingly, when the voltage at the input node $V_{i+}$ is at a logical high voltage, the charge on the output node $V_{O-}$ may only discharge when the voltage on the output node $V_{O-}$ (i.e., the voltage on the drain and the gate of the left first PMOS load element transistor P408) is close to the voltage on the drain and the gate of the first PMOS load element transistor P601R, that is, the voltage level at the $V_{BPS}$ node, that is, the reference voltage $V_{SW}$.

Simultaneously, the input node $V_{i-}$ is at a logical low voltage. Accordingly, the right NMOS input transistor N406 is OFF and the channel of the right NMOS input transistor N406 is not conducting, thereby allowing a charge build up on the output node $V_{O+}$, through the right symmetric load 424, to a value close to the supply voltage $V_{DD}$. Also, the speed of the transition of the output node $V_{O+}$ from discharged to charged is related to the extent to which the channel in the right second PMOS load element transistor P416 is conducting, which extent is controlled by the bias voltage $V_{BP}$.

Subsequently, when the voltage at the input node $V_{i+}$ switches to a logical low voltage, the left NMOS input transistor N404 turns OFF and the channel of the left NMOS input transistor N404 stops conducting, thereby allowing a charge to build up again on the output node $V_{O-}$. The output node $V_{O-}$ charges, through the left symmetric load 422, to a value close to the supply voltage $V_{DD}$. The speed of the transition of the output node $V_{O-}$ from discharged to charged is related to the extent to which the channel in the left second PMOS load element transistor P412 is conducting, which extent is controlled by the bias voltage $V_{BP}$.

Simultaneously, the input node $V_{i-}$ switches to a logical high voltage. Accordingly, the right NMOS input transistor N406 turns ON and the channel of the right NMOS input transistor N406 begins conducting, thereby allowing the output node $V_{O+}$ to discharge through the right NMOS input transistor N406 and the lower NMOS transistor N402. The speed of the transition of the output node $V_{O+}$ from charged to discharged is related to the extent to which the channel in the lower NMOS transistor N402 is conducting, which extent is controlled by the bias voltage $V_{BN}$.

As discussed above in relation to the voltage at the input node $V_{i+}$ being at a logical high voltage, when the voltage at the input node $V_{i-}$ is at a logical high voltage, the charge on the output node $V_{O+}$ may only discharge until the voltage on the output node $V_{O+}$ (i.e., the voltage on the drain and the gate of the right first PMOS load element transistor P420) is equal to the voltage on the drain and the gate of the first PMOS load element transistor P601R, that is, the voltage level at the $V_{BPS}$ node, that is, the reference voltage $V_{SW}$.

In summary, the speed of transition between charged and discharged for the output nodes $V_{O-}$ and $V_{O+}$ remains to be determined by the values of bias voltages $V_{BN}$ and $V_{BP}$. However, rather than changing with $V_{BP}$, the lower extent of the swing of the output voltage is constantly $V_{SW}$. This constant lower voltage swing extent may be attributed, in part, to the isolation of the gate of the second PMOS load element transistor P602R, i.e., the $V_{BP}$ node, from the drain of the second PMOS load element transistor P602R.

The output of the delay element 202 with the bias voltages $V_{BN}$ and $V_{BP}$ supplied by the first bias generator 600 may be shown to be an AC signal with a constant voltage swing U, where the voltage swing U is the difference between the value of the supply voltage $V_{DD}$ and the value of the voltage applied to the $V_{SW}$ node. The voltage swing U is generally constant for a given set of operating conditions and process parameters. An increase in the AC signal frequency may be achieved here by increasing the currents driving (charging and discharging) node $V_{O+}$ and node $V_{O-}$ capacitances. Based on the constant voltage swing U, the rate of increase in the currents relative to the rate of increase of the frequency is lower than the same rate in the delay element 202 with bias voltages $V_{BN}$ and $V_{BP}$ supplied by the known bias generator 300. This benefit arises due to the nodes $V_{O+}$ and $V_{O-}$ not having to be driven to a greater voltage difference, which difference increases with frequency. Conveniently, where the first bias generator 600 is used in place of the known bias generator 300, a more efficient use is made of the currents and less current is consumed.

Figure 9:
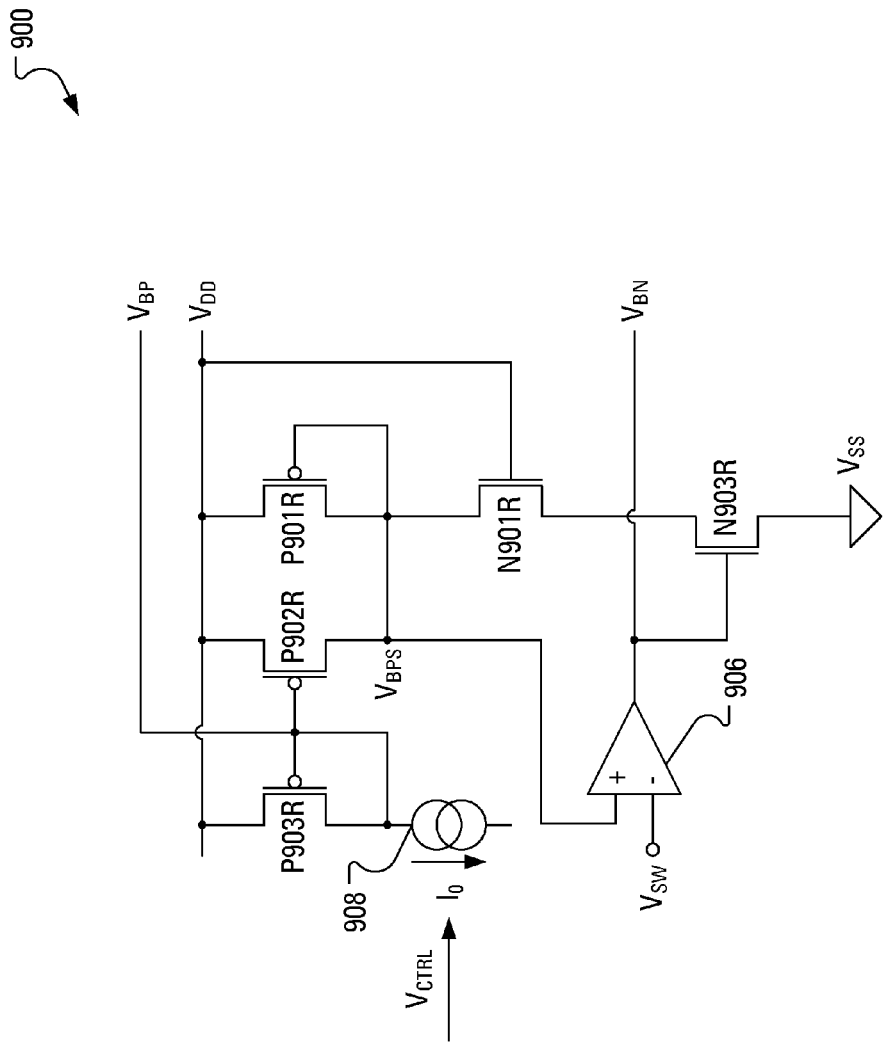
FIG. 9 illustrates a bias generator according to another example embodiment.

FIG. 9 schematically illustrates a second bias generator 900 suited for use with the delay element 202 with the structure as illustrated in FIG. 4, as an alternative to the first bias generator 600 of FIG. 6. As shown from the bottom up, the second bias generator 900 includes a lower NMOS transistor N903R. The source of the lower NMOS transistor N603R is connected to a voltage source $V_{SS}$. The gate of the lower NMOS transistor N603R is connected to a $V_{BN}$ node. The $V_{BN}$ node also receives output from a differential amplifier 906. The drain of the lower NMOS transistor N903R is connected to the source of an intermediate NMOS transistor N901R.

The gate of the intermediate NMOS transistor N901R is connected to a voltage source $V_{DD}$ and the drain of the intermediate NMOS transistor N901R is connected to an intermediate node, labeled "$V_{BPS}$". The $V_{BPS}$ node is connected to the drain of a first PMOS load element transistor P901R and to the drain of a second PMOS load element transistor P902R. The sources of the PMOS load element transistors P901R, P902R are connected to the voltage source $V_{DD}$. The gate of the second PMOS load element transistor P902R is connected to the $V_{BP}$ node. The gate of the first PMOS load element transistor P901R is connected to the $V_{BPS}$ node. The $V_{BPS}$ node is connected to the non-inverting input of a differential amplifier 906, whose output is connected to the $V_{BN}$ node, as stated hereinbefore. A PMOS mirror transistor P903R is provided, with gate and drain connected to the $V_{BP}$ node and the source connected to the voltage source $V_{DD}$. In combination, the PMOS minor transistor P903R and the second PMOS load element transistor P902R form a current mirror. Also connected to the $V_{BP}$ node is a current source 908, which generates a reference current, $I_0$, based on the delay control voltage $V_{CTRL}$. The current source 908 directly controls the current in the PMOS mirror transistor P903R and, consequently, by way of the operation of the current mirror, the current source 908 indirectly controls the current in the second PMOS load element transistor P902R. In one implementation, the current source 908 is a MOS transistor current with the delay control voltage $V_{CTRL}$ being the MOS transistor source-gate voltage.

The first PMOS load element transistor P901R, the second PMOS load element transistor P902R, the intermediate NMOS transistor N901R and the lower NMOS transistor N903R are all straight or scaled replicas (similarly sized or scaled) of the counterpart transistors of the delay element 202, including the left first PMOS load element transistor P408, the left second PMOS load element transistor P412, the left NMOS input transistor N404, the right first PMOS load element transistor P420, the right second PMOS load element transistor P416, the right NMOS input transistor N406 and the lower NMOS transistor 402.

The prominent difference between the second bias generator 900 and the first bias generator 600 lies in the insertion point of the reference (delay-controlling) current $I_0$. In the second bias generator 900, the delay-controlling current $I_0$ is supplied to the PMOS current minor formed by the PMOS minor transistor P903R and the second PMOS load element transistor P902R and then balanced by the drain current of the lower NMOS transistor N903R. This insertion point contrasts with the supply, the first bias generator 600, of the delay-controlling current $I_0$ to the current mirror formed by the NMOS minor transistors N603R, N604R, which current is then balanced by the collective current of the PMOS load element transistors P601R, P602R. The second bias generator 900, in a manner similar to the first bias generator 600, outputs two bias voltages, $V_{BN}$ and $V_{PN}$, whose values are derived from the delay-controlling current $I_0$, the value of which is based on the delay control voltage $V_{CTRL}$.

In operation, when the delay element 202 is biased by the second bias generator 900, the voltage swing of signal present between the output nodes $V_{O+}$ and $V_{O-}$ (the AC signal voltage swing) has voltage $V_{DD}$ as an upper limit and the bias voltage $V_{SW}$ as a lower limit. The $V_{SW}$ voltage is received, in a manner similar to the manner in which the $V_{SW}$ voltage is received in the first bias generator 600, from a reference voltage generator.

If the delay-controlling current $I_0$ increases, corresponding to a change in the delay control voltage $V_{CTRL}$, then the source to gate voltage of the PMOS minor transistor P903R also increases. An increase in the voltage difference between the source, which is connected to the supply voltage $V_{DD}$, and the gate, which is connected to the $V_{BP}$ node, leads to a decrease in the voltage level at the $V_{BP}$ node. An increase in the source to gate voltage of the PMOS mirror transistor P903R also means that the source to gate voltage of the second PMOS load element transistor P901R increases correspondingly. As a result, the current in the second PMOS load element transistor P901R increases, which leads to an increase in the current through the intermediate NMOS transistor N901R and the lower NMOS transistor N903R. In particular, the increase in the current in the lower NMOS transistor N903R leads to an increase in the gate to source voltage for the lower NMOS transistor N903R. Notably, the gate to source voltage for the lower NMOS transistor N903R is representative of the voltage level of the bias voltage $V_{BN}$. In this manner, an increase in the delay-controlling current $I_0$ leads to an increase in the bias voltage $V_{BN}$ and a decrease in the bias voltage $V_{BP}$. Under the converse conditions, a similar analysis applies, that is, a decrease in the delay-controlling current $I_0$ leads to a decrease in the bias voltage $V_{BN}$ and to an increase in the bias voltage $V_{BP}$.

Current consumption in the delay element 202 when biased by either the first bias generator 600 or the second bias generator 900 can be shown, in many instances, to be significantly less than current consumption in the delay element 202 when biased by the known bias generator 300. Indeed, it can be shown that, depending on the level selected for the voltage $V_{SW}$, the savings in current consumption may range from about 10% to more than 50%. At lower frequencies, the delay element 202 biased by the first bias generator 600 or the second bias generator 900 may consume the same amount of power as the delay element 202 biased by the known bias generator 300, or may consume more power. However, as the frequency of the AC signal increases, an amount of power savings, realized through the use of the first bias generator 600 or the second bias generator 900, increases.

Notably, the intermediate NMOS transistor N901R may be omitted, in which case, the lower level of the AC swing in the delay line will deviate more from $V_{BPS}$.

Figure 10:
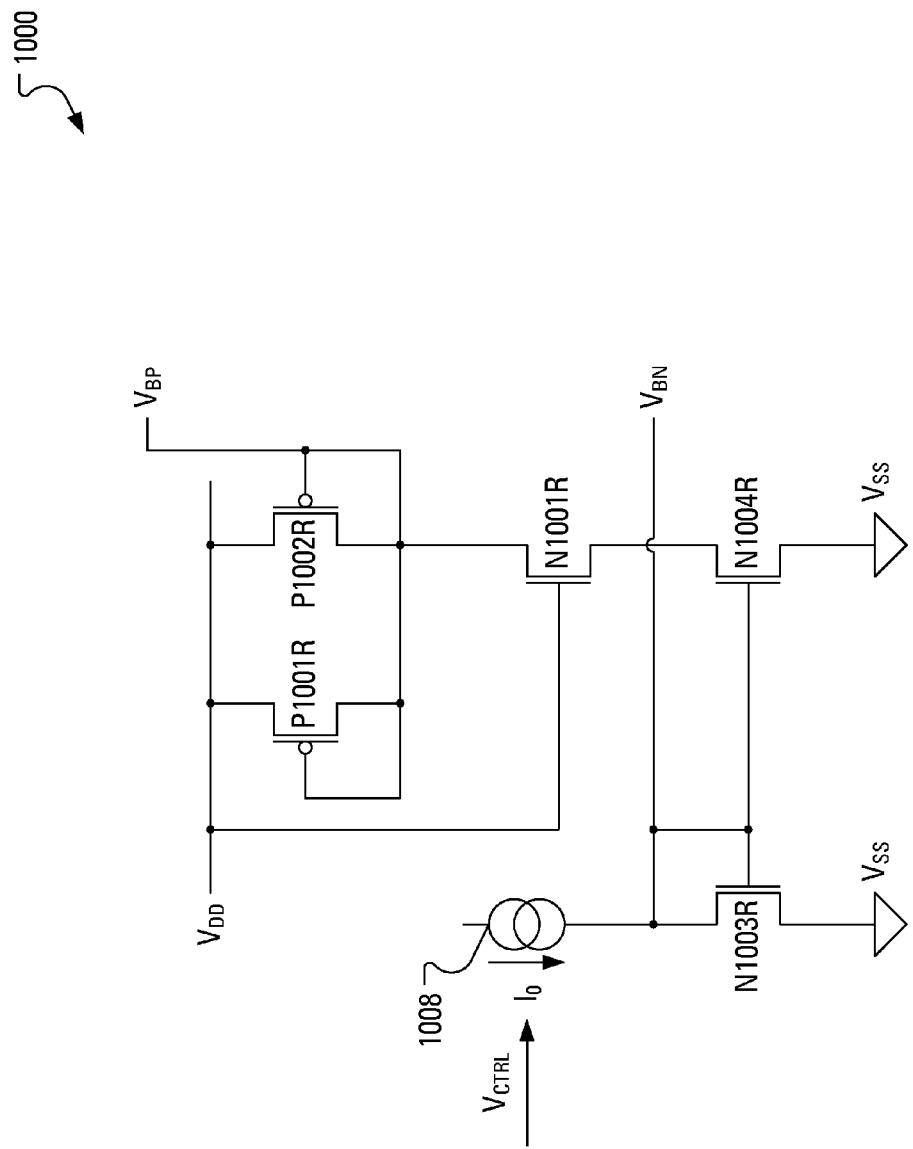
FIG. 10 illustrates a bias generator according to still another example embodiment, the bias generator including a voltage-controlled current source.

FIG. 10 schematically illustrates a third bias generator 1000 suited for use with the delay element 202 with the structure as illustrated in FIG. 4, as an alternative to the first bias generator 600 of FIG. 6 and the second bias generator 900 of FIG. 9.

As shown from the bottom up, the third bias generator 1000 includes an NMOS current mirror made up of a first NMOS minor transistor N1003R and a second NMOS minor transistor N1004R. The sources of the NMOS minor transistors N1003R, N1004R are connected to a voltage source $V_{SS}$. The gates of the NMOS mirror transistors N1003R, N1004R are connected to each other and to the drain of the first NMOS minor transistor N1003R. The drain of the first NMOS mirror transistor N1003R is also connected to a $V_{BN}$ node, i.e., a node from which the NMOS bias voltage $V_{BN}$ is provided to the delay elements 202. The $V_{BN}$ node receives a reference current, $I_0$, generated by a current source 1008 based on the delay control voltage $V_{CTRL}$.

The drain of the second NMOS mirror transistor N1004R is connected to the source of an intermediate NMOS transistor N1001R. The gate of the intermediate NMOS transistor N1001R is connected to a voltage source $V_{DD}$ and the drain of the intermediate NMOS transistor N1001R is connected to a $V_{BP}$ node, i.e., a node from which the PMOS bias voltage $V_{BP}$ is provided to the delay elements 202. The $V_{BP}$ node is connected to the gate and the drain of a first PMOS load element transistor P1001R and to the gate and the drain of a second PMOS load element transistor P1002R. The sources of the PMOS load element transistors P1001R, P1002R are connected to the voltage source $V_{DD}$.

Notably, the output voltage swing in the delay element 202, when biased by the third bias generator 1000, is not constant. Indeed, the lower extent of the output voltage swing, in one implementation, is $V_{BP}$, which changes as the frequency of the output voltage signal changes. Accordingly, the delay element 202, when biased by the third bias generator 1000, does not feature lower power consumption compared to the known bias generator 300. Conveniently however, the third bias generator 1000 is simpler in structure than the known bias generator 300 of FIG. 3, the first bias generator 600 of FIG. 6 and the second bias generator 900 of FIG. 9. In part, the simplicity is derived from basing operation solely on current mirrors: a PMOS current minor formed by the first PMOS load element transistor P1001R and the second PMOS load element transistor P1002R; and an NMOS current mirror formed by the second NMOS mirror transistor N1004R and the first NMOS minor transistor N1003R. In contrast to the previously discussed bias generators 300, 600, 900, the third bias generator 1000 does not have to have a differential amplifier. As such, the third bias generator 1000 will, in at least some instances, be easier to implement, potentially more stable and occupy smaller area on silicon than any of the previously discussed bias generators 300, 600, 900.

The first PMOS load element transistor P1001R and the second PMOS load element transistor P1002R may be a similar size or scaled compared to the counterpart transistors of the delay element 202, including the left first PMOS load element transistor P408, the left second PMOS load element transistor P412, the right first PMOS load element transistor P420 and the right second PMOS load element transistor P416. The second NMOS minor transistor N1004R may be a similar size or scaled compared to the counterpart transistor of the delay element 202, namely the left NMOS input transistor N404. If all the transistors in the third bias generator 1000 exactly mimic related transistors in the delay element 202, it should follow that the lower limit of the AC signal swing at the output nodes $V_{O+}$, $V_{O-}$ will be close to the non-constant bias voltage $V_{BN}$ and, as such, the voltage swing U will change with the frequency of the output, rather than being constant, as it is in the first bias generator 600 of FIG. 6 and the second bias generator 900 of FIG. 9.

If the reference (delay-controlling) current $I_0$ increases, corresponding to a change of the delay control voltage $V_{CTRL}$, then the gate to source voltage of the first NMOS minor transistor N1003R (i.e., the bias voltage $V_{BN}$) also increases. Additionally, the current increases in the second NMOS minor transistor N1004R, the intermediate NMOS transistor N1001R and at least the first PMOS load element transistor P1001R, minoring the increase in the delay-controlling current $I_0$. The increase in current in the first PMOS load element transistor P1001R, in particular, leads to an increase in the source to gate voltage, which increase is associated with a decrease in the voltage level at the $V_{BP}$ node. In this manner, an increase in the delay-controlling current $I_0$ leads to an increase in the bias voltage $V_{BN}$ and a decrease in the bias voltage $V_{BP}$. Under the converse conditions, a similar analysis applies, that is, a decrease in the delay-controlling current $I_0$ leads to a decrease in the bias voltage $V_{BN}$ and to an increase in the bias voltage $V_{BP}$.

In the known bias generator 300, the current is obtained basically by applying the delay control voltage $V_{CTRL}$ as source-gate voltage of the second PMOS transistor 304 and using the channel current directly as a delay-controlling current. This approach is simpler but has a disadvantage of stronger dependence of a delay ($T_d$) vs. delay control voltage ($V_{CTRL}$) characteristic on operating conditions (temperature, $V_{DD}$ voltage value) and process parameter variations. For the delay element biased by the known bias generator 300, a distinct $T_d$ vs. $V_{CTRL}$ characteristic may be produced for each set of operating conditions and process parameters, effectively producing a family of characteristic curves. For the frequency range required by a given design specification, there will be a corresponding range of variation of the delay control voltage $V_{CTRL}$, which range of variation will broaden as the characteristic curves in the family spread further apart.

Notably, the intermediate NMOS transistor N1001R may be omitted, in which case, the lower level of the AC swing in the delay line will deviate more from $V_{BPS}$.

Figure 11:
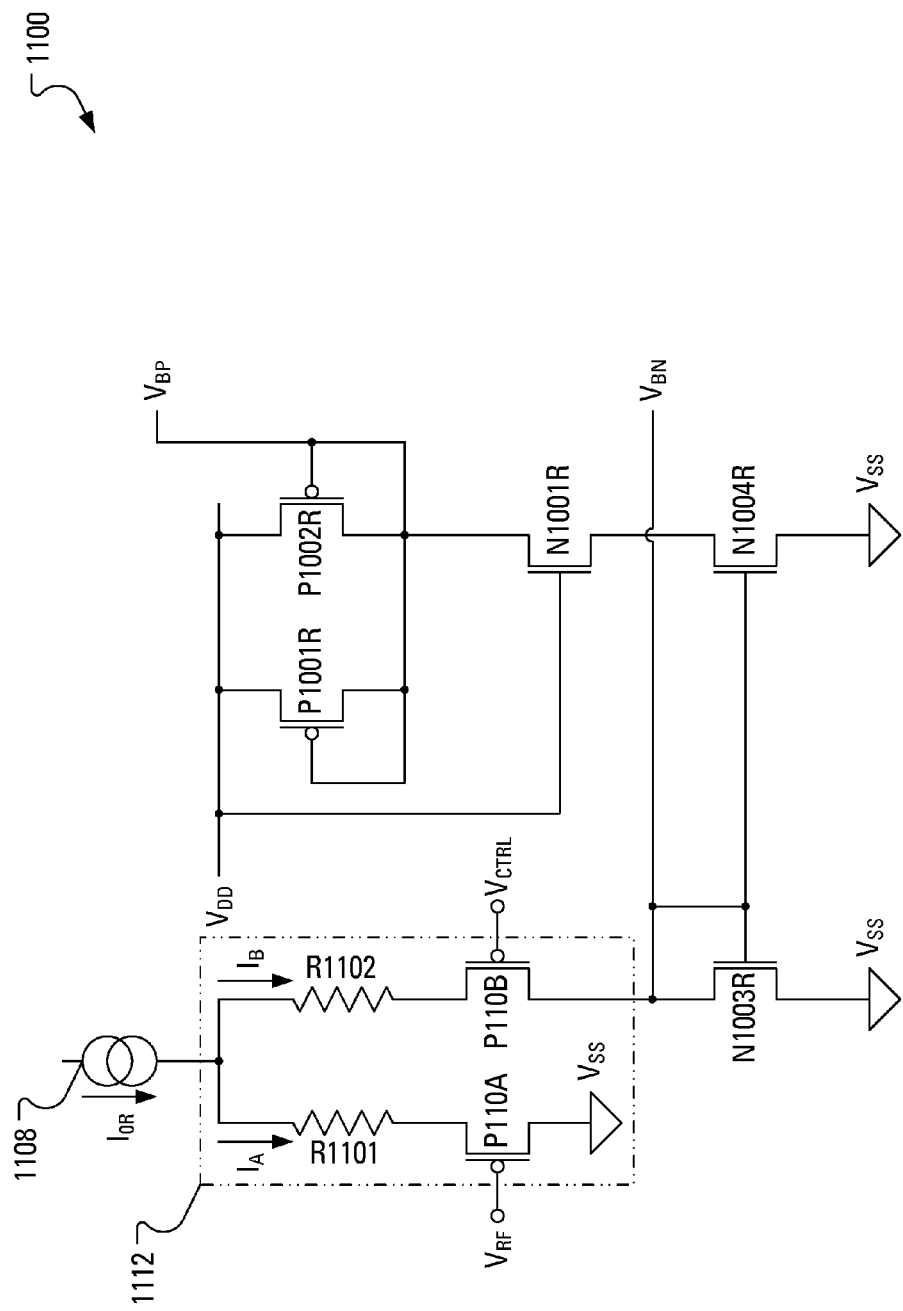
FIG. 11 illustrates the bias generator of FIG. 10 with an implementation of the voltage-controlled current source.

FIG. 11 schematically illustrates the third bias generator 1000 of FIG. 10 with an implementation of the current source 1008 based on the delay control voltage $V_{CTRL}$. The bias generator of FIG. 11 may be considered an inventive selection of the possible circuits represented by the third bias generator 1000 of FIG. 10 and is referred to hereinafter as the third bias generator 1100. In particular, the current source 1008 is implemented as a combination of a regulating circuit 1112 and a reference current generator 1108. Conveniently, for the implementation illustrated in FIG. 11, the maximum level of a delay-controlling current is limited to a certain value corresponding to the required maximum operation frequency. This prevents a current consumption surge when the scheme is held in the maximum frequency operation point.

The regulating circuit 1112 receives three external inputs: a reference current $I_{0R}$ from the reference current generator 1108; the delay control voltage $V_{CTRL}$ from the charge pump 104; and a reference voltage $V_{RF}$ from a reference voltage generator (not shown). A person of ordinary skill in the art will appreciate that there is a broad variety of ways by which to implement the reference current generator 1108. The reference current $I_{0R}$ may be provided as a stabilized current or a current with predetermined characteristics. The regulating circuit 1112 includes a first PMOS regulating transistor P110A and a second PMOS regulating transistor P110B. The drain of the first PMOS regulating transistor P110A is connected to the voltage source $V_{SS}$. The gate of the first PMOS regulating transistor P110A receives the reference voltage $V_{RF}$ and the source of the first PMOS regulating transistor P110A connects to a first resistor R1101, the other end of which connects to the reference current generator 1108. The drain of the second PMOS regulating transistor P110B is connected to the $V_{BN}$ node. The gate of the second PMOS regulating transistor P110B receives the delay control voltage $V_{CTRL}$ and the source of the second PMOS regulating transistor P110B connects to a second resistor R1102, the other end of which connects to the reference current generator 1108.

In operation of the third bias generator 1000 implemented as illustrated in FIG. 11, the reference voltage $V_{RF}$ is received by the third bias generator 1000 of FIG. 10 from a reference voltage generator (not shown). The receipt of a reference voltage should be familiar in view of the receipt of the voltage level $V_{SW}$ by the first bias generator 600 of FIG. 6 and by the second bias generator 900 of FIG. 9. The reference voltage $V_{RF}$ may be either stable or may have a predetermined (designed-in) dependence on operating conditions and/or on process parameters.

The third bias generator 1000 implemented as illustrated in FIG. 11 regulates current through the first NMOS minor transistor N1003R, which current, in turn, controls all of the currents in the third bias generator 1000 and the delay elements 202 according to variations in the value of the delay control voltage $V_{CTRL}$ around the level of the reference voltage $V_{RF}$.

The value of the reference current $I_0$ in the first bias generator 600 of FIG. 6, the second bias generator 900 of FIG. 9 and the third bias generator 1000 of FIG. 10 is determined by value of the delay control voltage $V_{CTRL}$. In contrast, the reference current $I_{OR}$ in the third bias generator 1100 of FIG. 11 is not determined by value of the delay control voltage $V_{CTRL}$. Instead, the reference current $I_{OR}$ is constant (that is, independent of $V_{CTRL}$) and the delay-controlling current, which is determined by value of the delay control voltage $V_{CTRL}$, is the drain current, $I_B$, of the second PMOS regulating transistor P110B. The first PMOS regulating transistor P110A and the second PMOS regulating transistor P110B are a differential pair. The reference current $I_{OR}$ is distributed as a first current, $I_A$, through the channel of the first PMOS regulating transistor P110A and a second current, $I_B$, through the channel of the second PMOS regulating transistor P110B. When the delay control voltage $V_{CTRL}$ changes around the (constant) reference voltage $V_{RF}$, the distribution of the reference current between the first and second currents changes. When the delay control voltage $V_{CTRL}$ is greater than the reference voltage $V_{RF}$, $I_A < I_B$ and less of the reference current $I_{OR}$ goes through the first PMOS regulating transistor P110A and more of the reference current $I_{OR}$ goes through the second PMOS regulating transistor P110B. When the delay control voltage $V_{CTRL}$ is greater than the reference voltage $V_{RF}$, $I_A > I_B$ and more of the reference current $I_{OR}$ goes through the first PMOS regulating transistor P110A and more of the reference current $I_{OR}$ goes through the second PMOS regulating transistor P110B. This way, the delay-controlling current (i.e., $I_B$, the drain current of the second PMOS regulating transistor P110B) varies with variations in the delay control voltage $V_{CTRL}$.

If the delay-controlling current $I_B$ increases, corresponding to a decrease in the delay control voltage $V_{CTRL}$, then the gate to source voltage of the first NMOS minor transistor N1003R (i.e., the bias voltage $V_{BN}$) also increases. Additionally, the current increases in the second NMOS minor transistor N1004R, the intermediate NMOS transistor N1001R and at least the first PMOS load element transistor P1001R, minoring the increase in the delay-controlling current $I_B$. The increase in the current in the first PMOS load element transistor P1001R leads to an increase in the source to gate voltage, which increase is associated with a decrease in the voltage level at the $V_{BP}$ node. In this manner, an increase in the drain current of the second PMOS regulating transistor P110B leads to an increase in the bias voltage $V_{BN}$ and a decrease in the bias voltage $V_{BP}$. Under the converse conditions, a similar analysis applies, that is, a decrease in the drain current of the second PMOS regulating transistor P110B leads to a decrease in the bias voltage $V_{BN}$ and to an increase in the bias voltage $V_{BP}$.

Figure 12A:
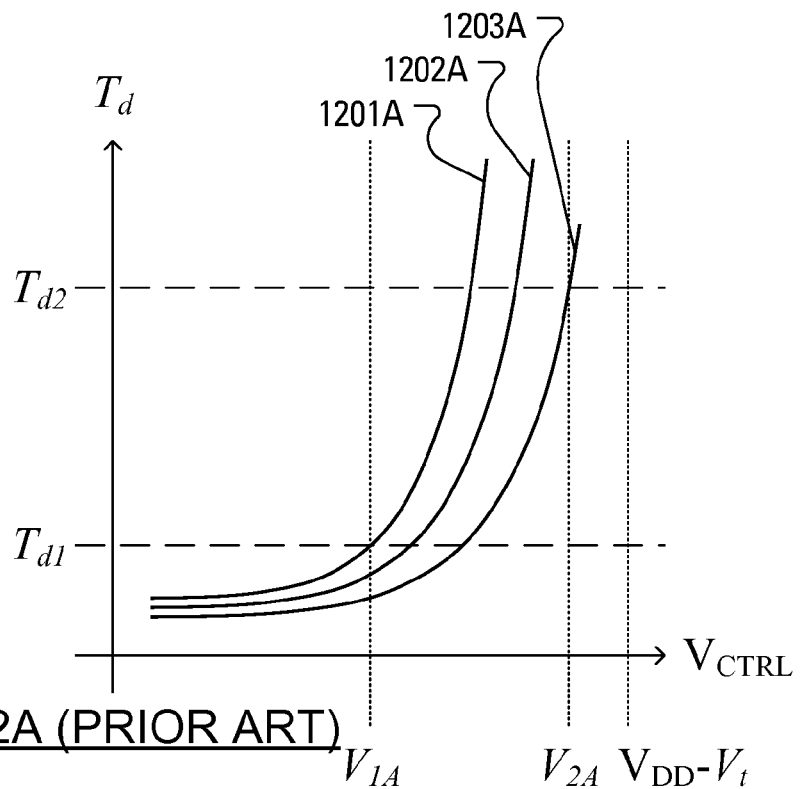
FIG. 12A illustrates delay vs. delay control voltage characteristics for a delay element with the structure as illustrated in FIG. 4 as biased by the bias generator of FIG. 3.

FIG. 12A illustrates delay vs. delay control voltage ($T_d$ vs. $V_{CTRL}$) characteristics for the delay element 202 with the structure as illustrated in FIG. 4 as biased by the known bias generator 300 of FIG. 3. Three characteristic curves are shown, corresponding to variations in operating conditions and process parameters. While the first characteristic curve 1201A is representative of operating conditions and process parameters that cause a relatively slow scheme operation, the third characteristic curve 1203A is representative of operating conditions and process parameters that cause a relatively fast scheme operation. The second characteristic curve 1202A is representative of operating conditions and process parameters that cause a typical scheme operation. A range of delays is illustrated in FIG. 12A as having limits at a first delay, $T_{d1}$, and a second delay, $T_{d2}$. A range of delay control voltages that correspond to the illustrated range of delays has limits at a first delay control voltage $V_{1A}$, corresponding to the first characteristic curve 1201A and the first delay $T_{d1}$, and a second delay control voltage $V_{2A}$, corresponding to the third characteristic curve 1203A and the second delay $T_{d2}$.

Figure 12B:
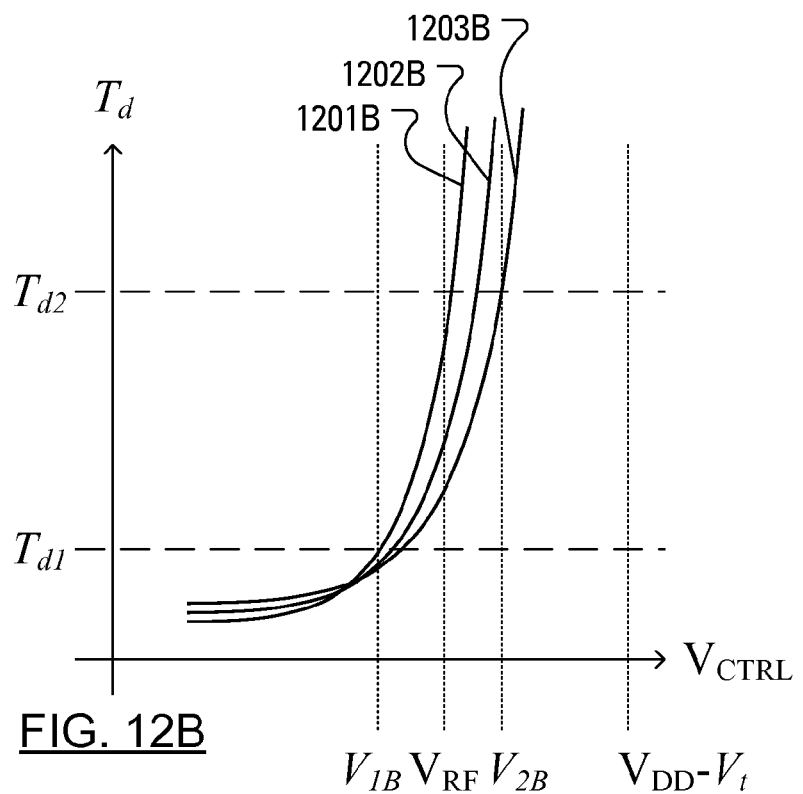
FIG. 12B illustrates delay vs. delay control voltage characteristics for a delay element with the structure as illustrated in FIG. 4 as biased by the bias generator illustrated in FIG. 11.

FIG. 12B illustrates delay vs. delay control voltage ($T_d$ vs. $V_{CTRL}$) characteristics for the delay element 202 with the structure as illustrated in FIG. 4 as biased by the third bias generator 1000 configured as illustrated in FIG. 11. Three characteristic curves are shown, corresponding to variations in operating conditions and process parameters. While the first characteristic curve 1201B is representative of operating conditions and process parameters that cause a relatively slow scheme operation, the third characteristic curve 1203B is representative of operating conditions and process parameters that cause a relatively fast scheme operation. The second characteristic curve 1202B is representative of operating conditions and process parameters that cause a typical scheme operation. Same range of delays that is illustrated in FIG. 12A is illustrated in FIG. 12B as having limits at the first delay, $T_{d1}$, and the second delay, $T_{d2}$. A range of delay control voltages that correspond to the illustrated range of delays has limits at a first delay control voltage $V_{1B}$, corresponding to the first characteristic curve 1201B and the first delay $T_{d1}$, and a second delay control voltage $V_{2B}$, corresponding to the third characteristic curve 1203B and the second delay $T_{d2}$.

It is notable that the range of delay control voltages for the delay element 202 as biased by the third bias generator 1100 of FIG. 11 (i.e., $V_{2B}-V_{1B}$) is less than the range of delay control voltages for the delay element 202 as biased by the known bias generator 300 of FIG. 3 (i.e., $V_{2A}-V_{1A}$). Restated, the range of delay control voltages possible when biasing using the third bias generator 1100 is narrower than the range of delay control voltages possible when biasing using the known bias generator 300. As advances in integrated circuit technology continue and $V_{DD}$ voltage levels continue to drop, a narrower range of delay control voltages may be considered increasingly beneficial.

Furthermore, due to the action of the first PMOS regulating transistor P110A and the second PMOS regulating transistor P110B, the characteristic curves 1201B, 1202B, 1203B of FIG. 12B "gravitate" around the reference voltage $V_{RF}$, which will tend to be somewhere in the middle of the voltage range. By regulating the value of the reference voltage $V_{RF}$, in the design represented by FIG. 11, the voltage range ($V_{2B}-V_{1B}$) may be shifted up and down within the power supply voltage range ($V_{DD}-V_{SS}$), thereby improving ease of proper operation for other parts of the system (e.g., the charge pump 104) and facilitating adjustment and maintenance of operating points. In the known bias generator 300 of FIG. 3, such a "center point" in the voltage range does not exist. Positioning of the voltage range ($V_{2A}-V_{1A}$) within the power supply voltage range ($V_{DD}-V_{SS}$) depends solely on a PMOS device characteristic (or an NMOS device characteristic, depending on implementation) and, as such, the positioning is a product of the production process.

Notably, a plot of characteristic curves for the delay element 202 with the structure as illustrated in FIG. 4 as biased by either the first bias generator 600 of FIG. 6 or the second bias generator 900 of FIG. 9 would display benefits when compared to the plot of characteristic curves in FIG. 12A.

For the known bias generator 300, the range of values for the current injected into the delay element 202 may be considered broad. In contrast, it may be shown that the current injected into the delay element 202 (the reference current provided by a current source) in the bias generators that provide for a consistent voltage swing U in the VCDL 108

(e.g., the bias generators 600 and 900 of FIGS. 6 and 9, respectively) varies over a relatively smaller range.

It is known that, in cases wherein a self-biased delay line is required to start operation at the highest frequency (e.g., in a DLL after power-up or reset), consumption of current may surge to a rather high value where the known bias generator 300 is used. Such a surge may overload a power supply. Also, it is notable that, for the known bias generator 300, the part of the current vs. frequency characteristic that corresponds to higher frequencies is rather flat. Accordingly, there comes a point at which providing more current into the known bias generator 300 and delay elements 202 increases the frequency only slightly.

The reference current $I_{OR}$, supplied by the reference current generator 1108 in the third bias generator 1000 in the implementation illustrated in FIG. 11, can be arranged to be invariant in response to variations in operating conditions and/or variations in the process parameters. Conveniently, under such constant current conditions, a self-biased delay line using the third bias generator 1100 does not require the surge of current that is ordinarily required for a high frequency start-up phase of a self-biased delay line using the known bias generator 300.

Figure 13:
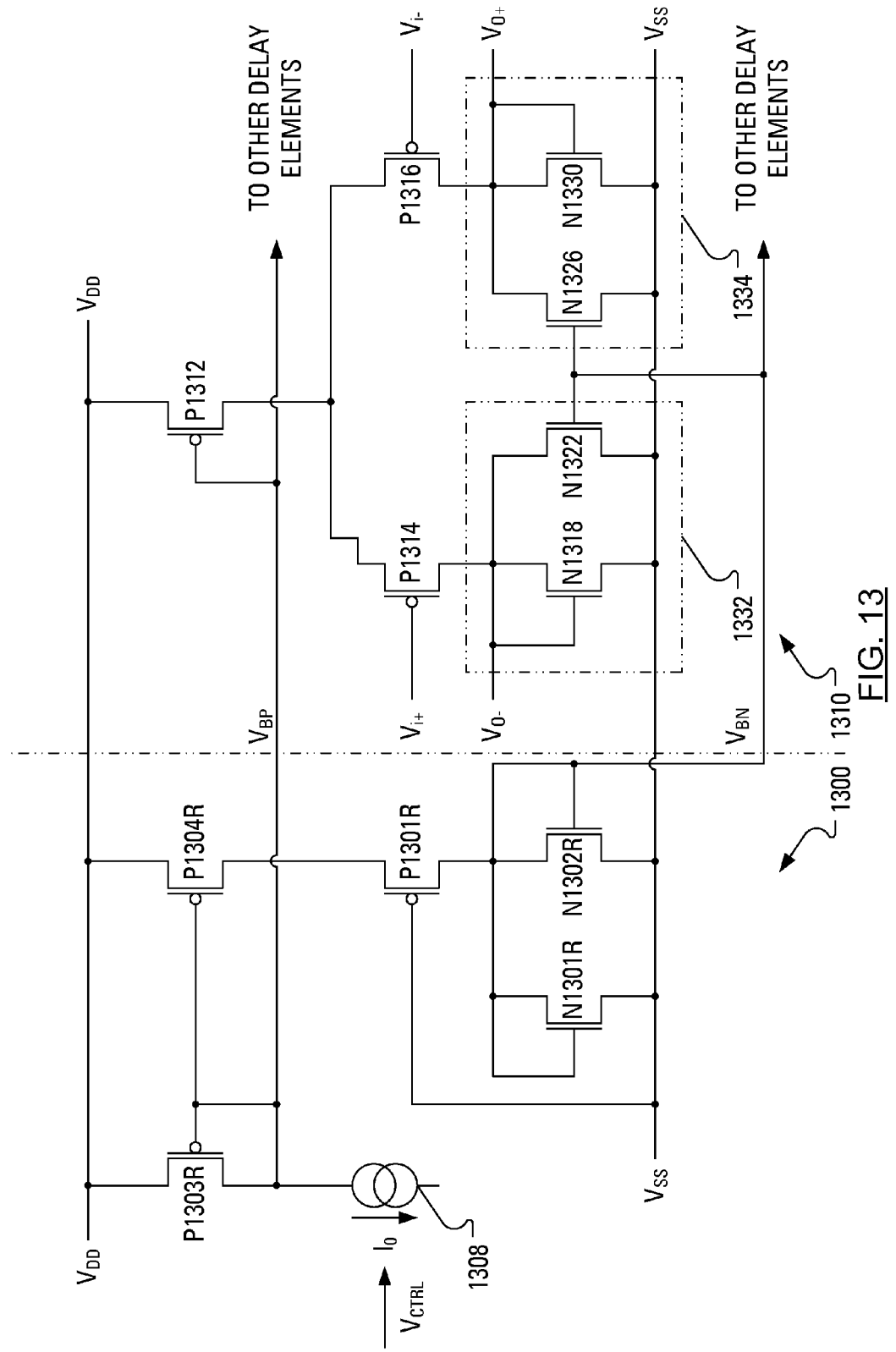
FIG. 13 illustrates an "inverted polarity" version of the bias generator of FIG. 10 in combination with an "inverted polarity" version of the delay element of FIG. 4.

A person of ordinary skill in the art will appreciate that any of the bias generator designs presented herein may be reconfigured by way of $V_{DD}$-$V_{SS}$ mirroring. FIG. 13 is presented as an illustrative example of $V_{DD}$-$V_{SS}$ mirroring. In particular, a fourth bias generator 1300 in FIG. 13 is an "inverted polarity" version representative of the third bias generator 1000 of FIG. 10. That is, NMOS devices have been used in place of PMOS devices and PMOS devices have been used in place of NMOS devices, with necessary size adjustments. Additionally, the fourth bias generator 1300 provides bias voltages $V_{BN}$ and $V_{BP}$ to a delay element 1310 that is an "inverted polarity" version of the delay element 202 of FIG. 4.

As shown from the top down, the fourth bias generator 1300 includes a PMOS current mirror made up of a first PMOS mirror transistor P1303R and a second PMOS mirror transistor P1304R. The sources of the PMOS mirror transistors P1303R, P1304R are connected to a voltage source $V_{DD}$. The gates of the PMOS mirror transistors P1303R, P1304R are connected to each other and to the drain of the first PMOS minor transistor P1303R. The drain of the first PMOS mirror transistor P1303R is also connected to a $V_{BP}$ node, i.e., a node from which the PMOS bias voltage $V_{BP}$ is provided to the delay element 1310. The $V_{BP}$ node receives a reference current, $I_0$, generated by a current source 1308 based on the delay control voltage $V_{CTRL}$.

The drain of the second PMOS mirror transistor P1304R is connected to the source of an intermediate PMOS transistor P1301R. The gate of the intermediate PMOS transistor P1301R is connected to a voltage source $V_{SS}$ and the drain of the intermediate PMOS transistor P1301R is connected to a $V_{BN}$ node, i.e., a node from which the NMOS bias voltage $V_{BN}$ is provided to the delay element 1310. The $V_{BN}$ node is connected to the gate and the drain of a first NMOS load element transistor N1301R and to the gate and the drain of a second NMOS load element transistor N1302R. The sources of the NMOS load element transistors N1301R, N1302R are connected to the voltage source $V_{SS}$.

As shown from the bottom up, the inverted polarity delay element 1310 of FIG. 13 includes an upper PMOS transistor P1312. The source of the upper PMOS transistor P1312 is connected to the voltage source $V_{DD}$. The gate of the upper PMOS transistor P1312 is supplied with the bias voltage $V_{BP}$ from the fourth bias generator 1300. The drain of the upper PMOS transistor P1312 is connected to two paths: a left path; and a right path.

The left path includes a left PMOS input transistor P1314. The source of the left PMOS input transistor P1314 is connected to the drain of the upper PMOS transistor P1312. The gate of the left PMOS input transistor P1314 is connected to an input node, $V_{i+}$, for receiving a portion of the differential input reference voltage, $V_{REF}$. The drain of the left PMOS input transistor P1314 is connected to an output node, $V_{O-}$. The output node $V_{O-}$ is also connected to the drain of a left first NMOS load element transistor N1318 and to the drain of a left second NMOS load element transistor N1322. The gate of the left first NMOS load element transistor N1318 is connected to the output node $V_{O-}$. The gate of the left second NMOS load element transistor N1322 is supplied with the bias voltage $V_{BN}$ from the fourth bias generator 1300. The sources of the left NMOS load element transistors N1318, N1322 are connected to the voltage source $V_{SS}$. Together, the left NMOS load element transistors N1318, N1322 make up a left symmetric load 1332.

The right path includes a right PMOS input transistor P1316. The source of the right PMOS input transistor P1316 is connected to the drain of the upper PMOS transistor P1312. The gate of the right PMOS input transistor P1316 is connected to an input node, $V_{i-}$, for receiving a portion of the differential input reference voltage, $V_{REF}$. The drain of the right PMOS input transistor P1316 is connected to an output node, $V_{O+}$. The output node $V_{O+}$ is also connected to the drain of a right first NMOS load element transistor N1330 and to the drain of a right second NMOS load element transistor N1326. The gate of the right first NMOS load element transistor N1330 is connected to the output node $V_{O+}$. The gate of the right second NMOS load element transistor N1326 is supplied with the bias voltage $V_{BN}$ from the fourth bias generator 1300. The sources of the right NMOS load element transistors N1330, N1326 are connected to the voltage source $V_{SS}$. Together, the right NMOS load element transistors N1330, N1326 make up a right symmetric load 1334.

In operation of the delay element 1310 illustrated in FIG. 13, the upper PMOS transistor P1312 is biased by the bias voltage $V_{BP}$. The left symmetric load 1332 functions as a variable resistor network. The left symmetric load 1332 outputs a current as a function of the voltage on the output node $V_{O-}$, which voltage varies symmetrically about the voltage $0.5*V_{CTRL}$. The right symmetric load 1334 also functions as a variable resistor network. The right symmetric load 1334 outputs a current as a function of the voltage on the output node $V_{O+}$, which voltage varies symmetrically about the voltage $0.5*V_{CTRL}$.

In particular, when the voltage at the input node $V_{i+}$ is at a logical high voltage, the left PMOS input transistor P1314 is OFF and the channel of the left PMOS input transistor P1314 is not conducting. Accordingly, any charge previously built up on the output node $V_{O-}$ to discharge through the left symmetric load 1332, to a value close to the supply voltage $V_{SS}$. The speed of the transition of the output node $V_{O-}$ from charged to discharged is related to the extent to which the channel in the left second NMOS load element transistor N1322 is conducting, which extent is controlled by the bias voltage $V_{BN}$.

Simultaneously, the input node $V_{i-}$ is at a logical low voltage. Accordingly, the right PMOS input transistor P1316 is ON and the channel of the right PMOS input transistor P1316 is conducting, thereby allowing a charge build up on the output node $V_{O+}$, through the right PMOS input transistor P1316 and the upper PMOS transistor P1312. The speed of the transition of the output node $V_{O+}$ from discharged to charged is related to the extent to which the channel in the upper PMOS transistor P1312 is conducting, which extent is controlled by the bias voltage $V_{BP}$.

Notably, the charge on the output node $V_{O+}$ may only build up until the voltage on the output node $V_{O+}$ (i.e., the voltage on the drain of the right second NMOS load element transistor N1326) is close to the voltage on the gate of the right second NMOS load element transistor N1326, that is, the bias voltage $V_{BN}$.

Subsequently, when the voltage at the input node $V_{i+}$ switches to a logical low voltage, the left PMOS input transistor P1314 turns ON and the channel of the left PMOS input transistor P1314 starts conducting, thereby allowing a charge to build up again on the output node $V_{O-}$ through the left PMOS input transistor P1314 and the upper PMOS transistor P1312. The speed of the transition of the output node $V_{O-}$ from discharged to charged is related to the extent to which the channel in the upper PMOS transistor P1312 is conducting, which extent is controlled by the bias voltage $V_{BP}$.

The charge on the output node $V_{O-}$ may only build up until the voltage on the output node $V_{O-}$ (i.e., the voltage on the drain of the left second NMOS load element transistor N1322) is close to the voltage on the gate of the left second NMOS load element transistor N1322, that is, the bias voltage $V_{BN}$.

Simultaneously, the input node $V_{i-}$ switches to a logical high voltage. Accordingly, the right PMOS input transistor P1316 turns OFF and the channel of the right PMOS input transistor P1316 stops conducting, thereby allowing the output node $V_{O+}$ to discharge through the right symmetric load 1334, to a value close to the supply voltage $V_{SS}$. The speed of the transition of the output node $V_{O+}$ from charged to discharged is related to the extent to which the channel in the right second NMOS load element transistor N1326 is conducting, which extent is controlled by the bias voltage $V_{BN}$.

If the reference (delay-controlling) current $I_0$ increases, corresponding to a change in the delay control voltage $V_{CTRL}$, then the source to gate voltage of the first PMOS minor transistor P1303R also increases. An increase in the source to gate voltage of the first PMOS minor transistor P1303R corresponds to a decrease in the bias voltage $V_{BP}$. Additionally, the current increases in the second PMOS mirror transistor P1304R, the intermediate PMOS transistor P1301R and at least the first NMOS load element transistor N1301R, mirroring the increase in the delay-controlling current $I_0$. The increase in current in the first NMOS load element transistor N1301R, in particular, leads to an increase in the gate to source voltage, which increase is associated with an increase in the voltage level at the $V_{BN}$ node. In this manner, an increase in the delay-controlling current $I_0$ leads to an increase in the bias voltage $V_{BN}$ and to a decrease in the bias voltage $V_{BP}$. Under the converse conditions, a similar analysis applies, that is, a decrease in the delay-controlling current $I_0$ leads to a decrease in the bias voltage $V_{BN}$ and to an increase in the bias voltage $V_{BP}$.

One of ordinary skill in the art will appreciate that, as the bias voltage $V_{BN}$ changes (i.e., as the charge pump 104 changes $V_{CTRL}$ in response to phase tracking adjustments received from the phase comparator 102), the resistivity of the symmetric loads 1332, 1334 also change. Such a change in the resistivity of the symmetric loads 1332, 1334 directly controls the frequency of the output voltage, $V_O$, by changing the delay of the signal through the delay element 1310.

Notably, the intermediate PMOS transistor P1301R may be omitted.

The above-described embodiments of the present application are intended to be examples only. Alterations, modifications and variations may be effected to the particular embodiments by those skilled in the art without departing from the scope of the application, which is defined by the claims appended hereto.

What is claimed is:

1. A bias generator for biasing delay elements in a delay line employing one or more delay elements, said bias generator comprising:
   a bias generator variable resistance load element, said bias generator variable resistance load element connected between a power supply voltage and a given node;
   a voltage-controlled current source for generating a reference current;
   a current mirror formed of a first side and a second side, said first side connected to said voltage-controlled current source so that current in said first side and current in said second side is established based on said reference current;
   a reference voltage generator for generating a reference voltage; and
   an operational amplifier with:
   a non-inverting input connected to said given node;
   an inverting input connected to said reference voltage generator to receive said reference voltage; and
   an output connected to control current in said bias generator variable resistance load element,
   wherein said operational amplifier adjusts said output to minimize a difference between voltage levels at said non-inverting input and said inverting input; and
   an intermediate field effect transistor (FET), having a drain connected to said given node and a gate connected to said power supply voltage, configured so that a current through said intermediate FET includes said current in said second side of said current mirror.

2. The bias generator of claim 1 wherein said reference voltage generator is configured to generate said reference voltage such that said reference voltage is invariant in response to variations in operating conditions and variations in process parameters.

3. The bias generator of claim 1 wherein said reference voltage generator is configured to generate said reference voltage such that said reference voltage has a predetermined dependence on operating conditions.

4. The bias generator of claim 3 wherein said operating conditions include an ambient temperature.

5. The bias generator of claim 3 wherein said operating conditions include a level of said power supply voltage.

6. The bias generator of claim 1 wherein said reference voltage generator is configured to generate said reference voltage such that said reference voltage has a predetermined dependence on process parameters.

7. At a bias generator, a method of controlling delay in delay elements in a delay line employing one or more delay elements, said method comprising:
   generating, at a voltage-controlled current source, a reference current;
   establishing, at a current mirror formed of a first side and a second side and based on said reference current received at said first side, current in said first side and current in said second side;
   generating, by a reference voltage generator, a reference voltage;
   receiving, at an inverting input of an operational amplifier, said reference voltage;

controlling, using output of said operational amplifier, current in a bias generator variable resistance load element, said bias generator variable resistance load element connected between a power supply voltage and a given node, said operational amplifier having:

a non-inverting input connected to said given node; and an inverting input connected to said reference voltage generator to receive said reference voltage; and adjusting, at said operational amplifier, said output to minimize a difference between voltage levels at said non-inverting input and said inverting input; and including current through an intermediate field effect transistor (FET), with a drain connected to said given node and a gate connected to said power supply voltage, in said current in said second side of said current mirror.

8. The method of claim 7 wherein said generating said reference voltage is invariant in response to variations in operating conditions and variations in process parameters.

9. The method of claim 7 wherein said generating said reference voltage comprises basing said generating on a predetermined dependence on operating conditions.

10. The method of claim 9 wherein said operating conditions include an ambient temperature.

11. The method of claim 9 wherein said operating conditions include a level of said power supply voltage.

12. The method of claim 7 wherein said generating said reference voltage comprises basing said generating on a predetermined dependence on process parameters.

* * * * *

UNITED STATES PATENT AND TRADEMARK OFFICE
CERTIFICATE OF CORRECTION

| | | |
|---|---|---|
| PATENT NO. | : 8,125,256 B2 | Page 1 of 1 |
| APPLICATION NO. | : 13/152478 | |
| DATED | : February 28, 2012 | |
| INVENTOR(S) | : Peter Vlasenko | |

It is certified that error appears in the above-identified patent and that said Letters Patent is hereby corrected as shown below:

Title Page

Item 73 should read
Assignee: MOSAID Technologies Incorporated, Kanata (CA)

Signed and Sealed this
Fourteenth Day of August, 2012

David J. Kappos
*Director of the United States Patent and Trademark Office*